(12) United States Patent
Fukuda et al.

(10) Patent No.: US 9,384,940 B2
(45) Date of Patent: Jul. 5, 2016

(54) CHARGED PARTICLE BEAM APPARATUS

(71) Applicant: Hitachi High-Technologies Corporation, Minato-ku, Tokyo (JP)

(72) Inventors: Muneyuki Fukuda, Tokyo (JP); Naomasa Suzuki, Tokyo (JP); Akira Ikegami, Tokyo (JP); Hideto Dohi, Tokyo (JP); Momoyo Enyama, Tokyo (JP); Tomoyasu Shojo, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/439,628

(22) PCT Filed: Oct. 21, 2013

(86) PCT No.: PCT/JP2013/078459
§ 371 (c)(1),
(2) Date: Apr. 29, 2015

(87) PCT Pub. No.: WO2014/069271
PCT Pub. Date: May 8, 2014

(65) Prior Publication Data
US 2015/0294833 A1 Oct. 15, 2015

(30) Foreign Application Priority Data
Oct. 29, 2012 (JP) ................................. 2012-237802

(51) Int. Cl.
*H01J 37/00* (2006.01)
*H01J 37/147* (2006.01)
(Continued)

(52) U.S. Cl.
CPC ........... *H01J 37/1478* (2013.01); *H01J 37/141* (2013.01); *H01J 37/147* (2013.01); *H01J 37/28* (2013.01); *H01J 2237/141* (2013.01); *H01J 2237/1415* (2013.01); *H01J 2237/1506* (2013.01); *H01J 2237/2801* (2013.01)

(58) Field of Classification Search
USPC ......................................................... 250/310
See application file for complete search history.

(56) References Cited

U.S. PATENT DOCUMENTS 5,298,136 A * 3/1994 Ramalingam ..... H01J 37/32055
204/192.38
6,452,175 B1 * 9/2002 Adamec ............... H01J 37/1478
250/310
(Continued)

FOREIGN PATENT DOCUMENTS

JP 59-171445 A 9/1984
JP 2000-348658 A 12/2000
(Continued)

*Primary Examiner* — Phillip A Johnston
(74) *Attorney, Agent, or Firm* — Miles & Stockbridge P.C.

(57) ABSTRACT

In order to provide a charged particle beam apparatus capable of high resolution measurement of a sample at any inclination angle, a charged particle beam apparatus for detecting secondary charged particles (115) generated by irradiating a sample (114) with a primary charged particle beam (110) is provided with a beam tilt lens (113) having: a yoke magnetic path member (132) and a lens coil (134) to focus the primary charged particle beam (110) on the sample (114); and a solenoid coil (133) configured to arrange the upper end on the side surface of the yoke magnetic path member (132) and arrange the bottom end between the tip end of the pole piece of the yoke magnetic path member (132) and the sample (114) in order to arbitrarily tilt the primary charged particle beam (110) on the sample (114).

15 Claims, 13 Drawing Sheets

(51) Int. Cl.
*H01J 37/141* (2006.01)
*H01J 37/28* (2006.01)

(56) References Cited

U.S. PATENT DOCUMENTS 6,614,026 B1 9/2003 Adamec
7,034,297 B2 * 4/2006 Petrov .................. G01N 23/225
250/306

2004/0119022 A1 6/2004 Sato et al.

FOREIGN PATENT DOCUMENTS

| JP | 2001-015055 A | 1/2001 |
| JP | 2003-517199 A | 5/2003 |
| JP | 2007-234620 A | 9/2007 |
| WO | WO 01/45136 A1 | 6/2001 |

* cited by examiner

LONGITUDINAL MAGNETIC FIELD (BZ)

TRANSVERSE MAGNETIC FIELD (BX)

CHARGED PARTICLE BEAM APPARATUS

TECHNICAL FIELD

The present invention relates to a charged particle beam apparatus including an objective lens having a beam tilt function (hereinafter referred to as a beam tilt lens).

BACKGROUND ART

Various methods are used for defect detection and length measurement and shape evaluation in a formation of a microcircuit such as an LSI. For example, with an optical test device, optical images of the microcircuit are generated and the images are tested for abnormality detection. However, these optical images have resolution that is insufficient to permit identification of very small shape features, and cannot satisfactorily perform distinction between a harmful defect and a harmless defect upon the circuit formation. A target sample of such a measurement and test device has been increasingly miniaturized following technical advancement, and for example, in a process of manufacturing a latest DRAM, a linewidth of a metal wire reaches 40 nm or below, and a logic IC has reached a gate dimension of 20 nm.

A defect test method by use of an electron beam is provided with sufficient resolution for imaging minute shape features of a contact hole, a gate, and wiring and shape features of a minute defect, and can be further used for classification and detection of a severe defect based on a shade image contrast of the defect shape. Therefore, for measurement and test of the microcircuit, a measurement and a test method putting a charged particle beam into practical use is considerably more advantageous than an optical test method.

A scanning electron microscope (SEM) as one of charged particle beam apparatuses focuses a charged particle beam emitted from an electron source of a heating type or an electric field discharge type to form a thin beam (probe beam), and scans this probe beam on a sample. Through this scanning, secondary charged particles (secondary electron or reflection electron) are generated from the sample, and providing these secondary charged particles as a luminance signal of image data in synchronization with the scanning of the primary charged particle beam provides a scanned image. In a typical scanning electron microscope, with an extraction electrode between the electron source to which a negative potential has been applied and a grounding potential, the electron emitted from the electron source is accelerated and irradiated to the sample.

There is a close relationship between resolution of a scanning type charged particle microscope such as the SEM and energy of the charged particle beam. Arrival of the primary charged particle beam with high energy at the sample (that is, great landing energy of the primary charged particle beam) causes the primary charged particle to enter deeply into the sample, thus widening a range of emission of the secondary electron and the reflection electron on the sample. As a result, the range of emission becomes wider than the probe size of the charged particle beam, resulting in remarkable deterioration in observation resolution.

In contrast, reducing energy of the primary charged particle beam too much in order to reduce the landing energy results in a remarkable increase in the probe size of the charged particle beam due to aberration of an objective lens, deteriorating the observation resolution.

To perform observation with high resolution, energy of the primary charged particle beam, the landing energy in particular, needs to be appropriately controlled in accordance with an observation target.

As a technology of controlling the landing energy, a retarding method is widely used. Specifically, with the retarding method, such a potential that decelerates the primary charged particle beam is applied to the sample to reduce the energy of the charged particle beam to desired energy immediately before arrival at the sample. However, as soon as the charged particle beam is inclined towards a sample to be observed, observation with high resolution can no longer be performed.

Disclosed in Patent Literature 1 is, as a technology of inclining a charged particle beam with respect to a sample to be observed while maintaining high resolution condition of an apparatus, late race on an electron optical orbit in, for example, a method of using focus operation of an objective lens by making the charged particle beam enter to outside of an axis of the objective lens.

Moreover, disclosed in Patent Literature 2 is a technology of correcting off-axis chromatic aberration occurring when two stages of deflection means adapted to deflect a charged particle beam in mutually opposite directions within a focus magnetic field of an objective lens are provided and the charged particle beam is inclined outside an axis of the objective lens.

Moreover, disclosed in Patent Literature 3 is a technology of performing correction with a Wien filter in which two stages of deflection means for passage of a charge particle beam through outside of an axis of an objective lens are provided closely to an electron source than the objective lens to thereby reduce resolution deterioration occurring upon inclination of the charged particle.

Further, disclosed in Patent Literature 4 is a technology of providing, in addition to deflection means within a focus magnetic field of the objective lens, a cup-shaped electrode for beam deceleration between the objective lens and a sample to thereby increase a beam inclination angle.

In addition, disclosed in Patent Literature 5 is an invention in which an orbit of a primary beam is caused by a deflector or a movable diaphragm to pass through outside of an axis and controlling its off-axis orbit to cancel aberration occurring on the objective lens at time be beam inclination by use of aberration of another lens.

CITATION LIST

Patent Literature

PTL 1: Japanese Patent Application Laid-open No. S59-171445
PTL 2: Japanese Patent Application Laid-open No. 2000-348658
PTL 3: Japanese Patent Application Laid-open No. 2001-15055
PTL 4: Japanese Unexamined Patent Application Publication No. 2003-517199
PTL 5: Japanese Patent Application Laid-open No. 2007-234620

SUMMARY OF INVENTION

Technical Problem

Resolution of a charged particle beam image is affected by a probe diameter of the charged particle beam, and to acquire a scanned image with high resolution, the probe diameter needs to be reduced. However, reducing the probe diameter requires strong beam reduction through shortening a focal point of the objective lens. To focus the beam on the sample with a short focal point, an objective lens is required which has strong lens operation accordingly. In case of an objective lens of a magnetic field type which focuses a beam by leaking the magnetic field to an optical axis of the primary charged particle beam, the amount of excitation needs to be increased in order to strengthen the lens operation.

The amount of a magnetic flux flowing through a magnetic path of the objective lens is restricted by magnetic saturation. Saturated magnetic flux density of the magnetic path is almost determined by a magnetic material forming the magnetic path. Therefore, even if the amount of magnetic flux passing through the magnetic path increases, the magnetic flux that cannot be accepted by the magnetic path leaks from somewhere in the magnetic path, as a result of which lens operation is not great enough to follow the increase in the amount of excitation. Especially in a case where acceleration voltage of the charged particle beam is increased to form a probe beam with high energy, there may arise a situation that the beam itself cannot be focused. Thus, it is impossible to provide, adjacently to the magnetic path of the objective lens, deflection means adapted to deflect a charged particle beam within a magnetic field for focus by the objective lens by use of the conventional technologies as described in Patent Literature 1 to 3.

Moreover, resolution of the charged particle beam apparatus is defined by the probe diameter of the beam, and a decrease in energy of the charged particle beam results in an increase in the probe diameter and thus resolution deterioration due to the chromatic aberration as described above. Therefore, with the retarding method, effect of the aberration can be more reduced by bringing a deceleration position of the charged particle beam closer to the sample. Thus, upon apparatus designing, a work distance of the objective lens is designed to be as small as possible. However, it is impossible to achieve physical contact between the objective lens and the sample, and thus there is limitation on the method of reducing the effect of aberration through work distance reduction. In particular in case of the retarding method, there is a great potential difference between a sample (or a sample stage) and the objective lens, and a too small work distance raises a risk of sample breakage due to discharge. Therefore, the apparatus cannot be fabricated by use of the conventional technologies as described in Patent Literature 1 to 3. Further, the cup-shaped electrode as described in Patent Literature 4 cannot be provided between the sample and the objective lens.

As described above, a focal point of the objective lens for aberration suppression has become increasingly shorter, and compared to on-axis aberration, aberration occurring upon beam inclination has increased. Thus, it is difficult of cancel the aberration occurring upon the beam inclination with another lens shown in Patent Literature 5. For example, even only a small change in the beam inclination requires a large change in the amount of aberration occurring on another lens. Further, a great change in an axis of the beam needs to be made. An operation of adjusting the aberration and the axis requires repeated monitoring and setting changes, which takes much time. Further, aberration required for cancelling the aberration may not be created by another lens.

It is an object of the invention to provide a charged particle beam apparatus capable of measuring samples with high resolution at a given inclination angle.

Solution to Problem

To address the object of the present invention, one embodiment refers to a charged particle beam apparatus irradiating a primary charged particle beam to a sample loaded on a stage to detect secondary charged particles generated by the irradiation, wherein the charged particle beam apparatus includes a beam tilt lens having a function of focusing the primary charged particle beam on the sample and inclining the primary charged particle beam onto the sample at a given angle, the beam tilt lens is a member with a hollow inside provided along a region surrounding the primary charged particle beam, has a gap for a pole piece at a bottom aperture end on a side opposing the sample, and further includes: a yoke magnetic path member characterized by having a lens coil therein;

a solenoid coil arranged in a manner such as to surround the pole piece at the central aperture end of the yoke magnetic path member from outside;

a lens coil power source supplying current to the lens coil to control a focus position of the primary charged particle beam; and a solenoid coil power source supplying current to the solenoid coil to control an inclination angle of the primary charged particle beam, and the solenoid coil has an upper end arranged on a side surface of the yoke magnetic path member and has a lower end arranged between the pole piece tip of the yoke magnetic path member and the sample.

Advantageous Effects of Invention

The present invention can provide a charged particle beam apparatus capable of measuring a sample with high resolution at a given inclination angle.

DESCRIPTION OF EMBODIMENTS

For simplicity, illustrated in the following embodiments are examples of application to mainly an apparatus using a scanning electron microscope, and a beam tilt lens of each embodiment can be applied to not only an electron beam but also general charged particle beam apparatuses also including an ion beam apparatus. Moreover, illustrated as a sample in the following embodiments is a semiconductor wafer, but any of a semiconductor wafer, a semiconductor substrate, a wafer missing piece on which a pattern is formed, a chip cut out from the wafer, a hard disc, a liquid crystal panel, etc., can be targeted as a sample used in various charged particle beam apparatuses for testing and measurement.

EXAMPLE 1

Illustrated in a first embodiment is an example of application to a scanning electron microscope.

Figure 1A:
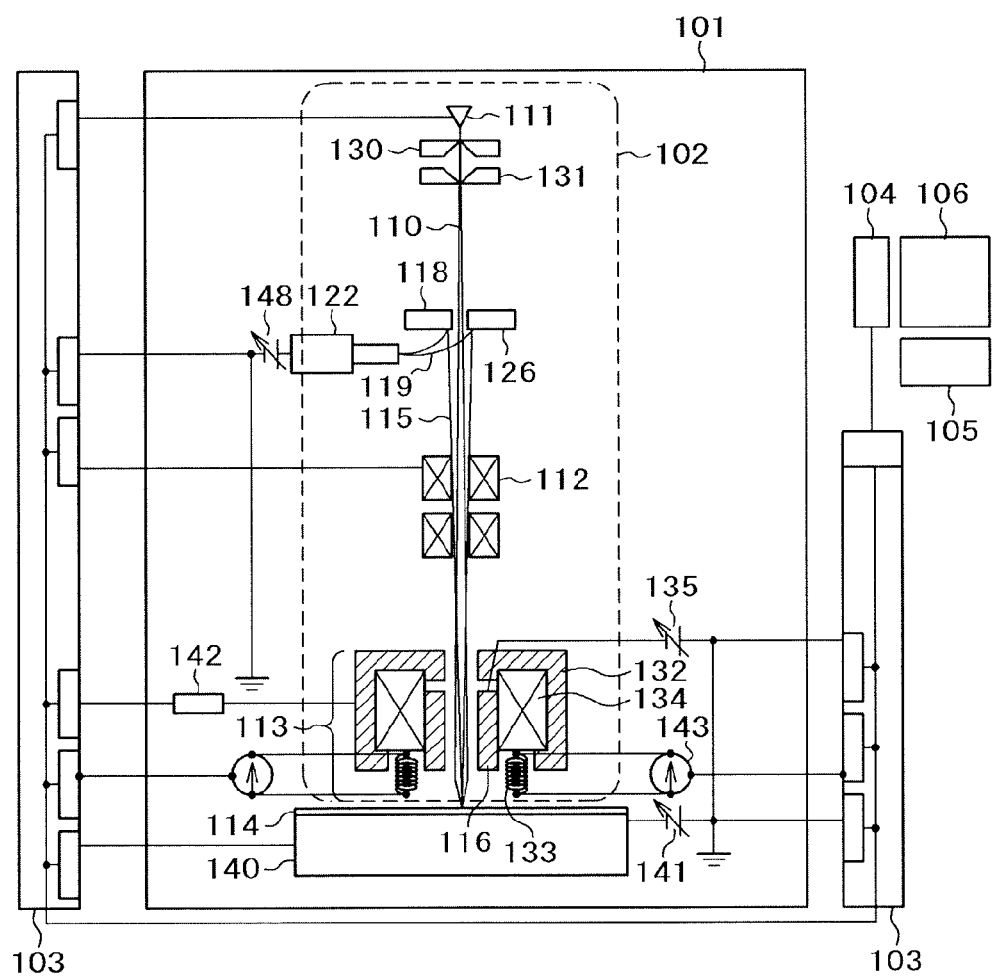
FIG. 1A is a schematic sectional view showing basic configuration of a charged particle beam apparatus (scanning electron microscope) according to a first embodiment.

FIG. 1A is a pattern diagram showing overall configuration of the scanning electron microscope. The scanning electron microscope of this embodiment includes: an electron optical system 102 formed in a vacuum housing 101; an electron optical system controller 103 arranged therearound; a host computer 104 controlling individual control units included in a control power source to perform integrated control of the entire apparatus; an operation console 105 connected to the controller; display means 106 including a monitor on which an acquired image is displayed; etc. The electron optical system controller 103 is composed of: a power source unit for supplying current and voltage to various components of the electron optical system 102; a signal control line for transferring a control signal to each of the components: etc.

The electron optical system 102 is composed of: an electron source 111 generating a primary electron beam (primary charged particle beam) 110; a deflector 112 deflecting the electron beam; a beam tilt lens 113 focusing and inclining the electron beam; a booster magnetic path member 116 focusing and diffusing secondary particles (a secondary electron) 115 discharged from a sample 114 held on a stage; a reflection member 118 for hitting by the secondary particles; a central detector 122 detecting a sub-particles (tertiary particles) 119 discharged again as a result of this hitting; etc. The reflection member 118 is formed of a disc-shaped metallic member formed with an aperture for passage of the primary beam, and its bottom surface forms a secondary particle reflection surface 126. Numeral 148 denotes a central incorporation power source for the central detector.

The primary electron beam 110 emitted from the electron source 111 is accelerated by a potential difference between an extraction electrode 130 and an acceleration electrode 131, and reaches the beam tilt lens 113. The beam tilt lens 113 controls a position of focus of the incident primary electron beam on the sample 114 with a lens coil power source 142, and controls an inclination angle with a solenoid coil power source 143.

Next, referring to FIG. 1B, inner configuration of the beam tilt lens 113 of this embodiment will be described in detail. In addition to the inner configuration of the beam tilt lens 113, a measured and tested sample 114 is also shown in FIG. 1B.

The beam tilt lens 113 of this embodiment is configured to include at least: a yoke magnetic path member 132 arranged around an optical axis of the primary electron beam (or a central axis of the electron optical system 102); a booster magnetic path member 116 provided in a space between the yoke magnetic path member 132 and the optical axis of the primary electron beam; a plurality of (two or more) solenoid coils 133 provided in a donut-shaped, closed space formed by the booster magnetic path member 116, the yoke magnetic path member 132, and the sample 114; and a lens coil 134. The optical axis of the primary electron beam or the central axis of the electron optical system 102 is so configured as to agree with a central axis of the beam tilt lens 113 or the vacuum housing 101 in many cases. Note that a lower end of this solenoid coil 133 is arranged between a tip end part of the booster magnetic path member 116 and the sample 114, and an upper end of this solenoid coil 133 is arranged between this booster magnetic path member 116 and this yoke magnetic path member 132. Moreover, used for this solenoid coil 133 is the one having a densely and spirally wound electric wire (insulated conductor) so that a magnetic field does not leak from the side surface between the aforementioned upper end and the aforementioned lower end. Note that instead of the solenoid coil obtained by the spirally winding an insulated electric conductor around an air core or a core of a non-magnetic material, a coil fabricated by a way of winding other than the spiral winding may be used. Moreover, the solenoid can be fixed to the booster magnetic path member or the yoke magnetic path member by use of a non-magnetic material.

Figure 1B:
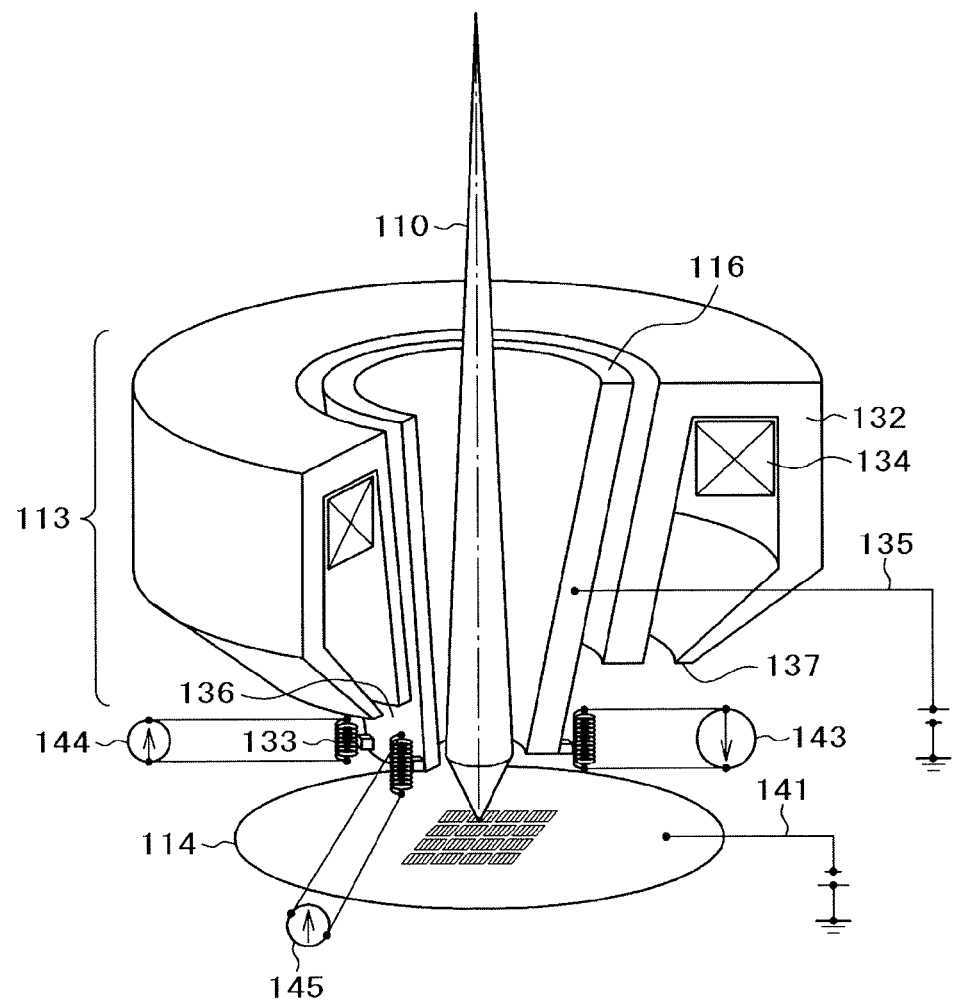
FIG. 1B is a perspective view of a beam tilt lens section in the charged particle beam apparatus according to the first embodiment.

The yoke magnetic path member 132 of FIG. 1B is formed of an annular member whose inside is hollow, and its sectional surface forms a trapezoid shape having a slope surface on a surface side opposing the optical axis of the primary electron beam. In the beam tilt lens 113 of this embodiment, the yoke magnetic path member 132 is arranged in a manner such that the optical axis of the primary electron beam passes through a center of the annular member. Held inside of the yoke magnetic path member 132 of the annular member is the lens coil 134, by which a magnetic flux for focusing the primary electron beam 110 is excited. Provided on an inner surface side of a lower bottom 137 of this trapezoid shape (the surface side opposing the primary electron beam) is a space, by which the excited magnetic flux flows to the booster magnetic path member 116 without forming a closed magnetic path in the yoke magnetic path member 132. Moreover, included on a top surface side of the yoke magnetic path member 132 (a direction in which the primary electron beam enters) and a bottom surface side (a direction in which the primary electron beam exits) thereof is an aperture through which the primary electron beam 110 passes. Moreover, used as a material of the yoke magnetic path member 132 is a soft magnetic material. Note that for the yoke magnetic path member 132 shown in FIG. 1B, the annular member having a sectional surface formed into a trapezoid shape is used, but the shape of the yoke magnetic path member 132 is not specifically limited as long as it fulfills a function of passing the excited magnetic flux to the booster magnetic path member 116. For example, the sectional surface of the yoke magnetic path member 132 may be U-shaped.

The booster magnetic path member 116 is a cylindrical (conical) member provided along an inner surface side of the annular member forming the yoke magnetic path member 132 (a region opposing the primary electron beam 110), and is arranged in a manner such that inside the beam tilt lens 113, a central axis of the cylinder agrees with the optical axis of the primary electron beam (or the central axis of the vacuum housing 101). Used as a material of the booster magnetic path member 116 is a soft magnetic material, as is the case with the yoke magnetic path member 132. A bottom side tip part (a tip part on a side opposing the sample) 136 of the cylinder forms a pole piece on which the magnetic flux excited by the lens coil 134 is focused.

Arranged on a bottom surface side of the yoke magnetic path member 132 is the solenoid coil 133. The solenoid coil 133 is a coil having a spirally wound insulated conductor so arranged as to surround the aforementioned booster magnetic path member 116 at a central part. The yoke magnetic path member 132 is so arranged as to be coaxial with the optical axis of the primary electron beam within the beam tilt lens 113. An aperture end part on the bottom surface side of the yoke magnetic path member 132 forms a pole piece on which a magnetic flux concentrates, and concentration of a magnetic flux in a gap between the pole piece of the yoke magnetic path member 132 and the pole piece of the booster magnetic path member 116 can bring about stronger lens effects for the primary electron beam 110 than the conventional one. The pole piece belonging to the booster magnetic path member 116 may be called top pole piece, and the pole piece belonging to the yoke magnetic path member may be called bottom pole piece. The yoke magnetic path member 132 and the booster magnetic path member 116 are spatially separated from each other with a predetermined gap in between. Note that the yoke magnetic path member 132 and the booster magnetic path member 116 are coupled to each other in a magnetically strong manner, and the magnetic flux excited by the lens coil 134 flows through inside of each of the aforementioned magnetic path members.

Next, potentials applied to the booster magnetic path member 116 and the yoke magnetic path member 132 will be described. The yoke magnetic path member 132 and the booster magnetic path member 116 are electrically insulated from each other by an insulation material. Supplied to the booster magnetic path member 116 is such a potential that becomes positive with respect to the potential of the yoke magnetic path member 132 and also that has a positive potential difference with respect to a potential of the aforementioned acceleration electrode 131. This potential is supplied by a booster power source 135. Moreover, for the yoke magnetic path member 132, a grounding potential is held. Thus, the primary electron beam 110 passes through the aforementioned booster magnetic path member 116 while most accelerated in an orbit of the primary electron beam 110 by the potential difference between the acceleration electrode 131 and the booster magnetic path member 116.

A retarding method is also adopted for the charged particle beam apparatus of this embodiment. Therefore, a retarding field needs to be formed between the beam tilt lens 113 and the sample 114. To the solenoid coil 133, current is supplied for the purpose of exciting a transverse magnetic field, and this current is supplied by solenoid coil power sources 143, 144, and 145. Moreover, applied to a stage 140 is such a potential that has a negative potential difference from that of the booster magnetic path member 116. Thus, the primary electron beam 110 which has passed through the booster magnetic path member 116 arrives at the abruptly decelerated sample surface. Here, landing energy of the primary beam is determined by only a potential difference between the electron source 111 and the stage 140, and thus control of the potentials applied to the electron source 111 and the stage 140 at predetermined values makes it possible to control the landing energy at a predetermined value regardless of what potentials are applied to the booster magnetic path member 116 and the acceleration electrode 131. Therefore, setting the potentials applied to the acceleration electrode 131 and the booster magnetic path member 116 positively with respect to the electron source 111 permits high-speed passage of the primary electron beam 110 through the electron optical system 102 and can also reduce a probe size of the primary electron beam 110 on the sample.

Figure 2A:
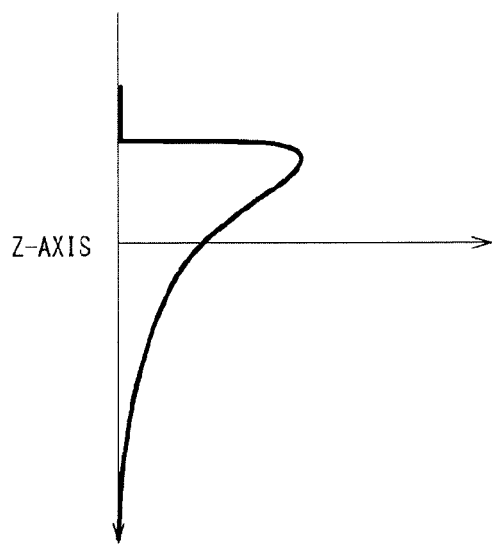
FIG. 2 are diagrams showing on-axis magnetic field distribution of the beam tilt lens shown in FIG. 1B, with FIG. 2A showing a longitudinal magnetic field and FIG. 2B showing a transverse magnetic field.
Figure 2B:
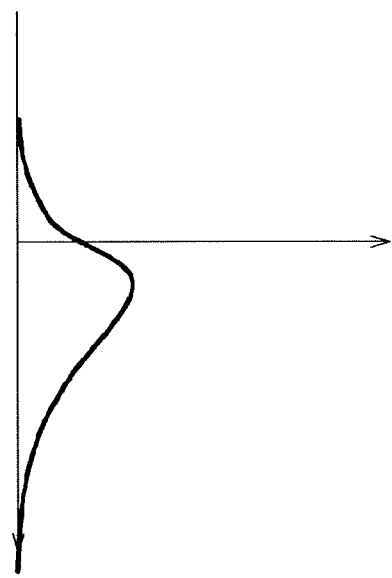

FIG. 2 are diagrams showing on-axis magnetic field distribution of the electron beam, with FIG. 2A showing a longitudinal magnetic field and FIG. 2B showing a transverse magnetic field. A Z-axis shown in the figures is a central axis along the orbit of the primary electron beam 110, and is indicated by an arrow directed from the beam tilt lens 113 (upper side) to the sample 114 (lower side). A horizontal axis is magnetic field intensity on the Z-axis, and a longitudinal magnetic field and the horizontal magnetic field are separately shown in two respective figures.

FIG. 2A is a diagram showing height dependence of the on-axis magnetic field distribution in a longitudinal direction parallel to the Z-axis. The longitudinal magnetic field is excited by the lens coil 134 in the beam tilt lens, and is inducted to tip ends of the pole pieces of the booster magnetic path member 116 and the yoke magnetic path member 132. Thus, there is a peak immediately below the tip end of the pole piece of the booster magnetic path member 116, and a peak shape is vertically asymmetrical.

FIG. 2B is a diagram showing height dependence of the on-axis magnetic field distribution in a transverse direction perpendicular to the Z-axis. The transverse magnetic field is excited by the solenoid coil 133. It is important to form the solenoid coil 133 with an air core or a non-magnetic core so as not to disturb the longitudinal magnetic field.

A peak position of the transverse magnetic field excited by the solenoid coil 133 is formed more closely to a sample side on the bottom in the figure than a peak position of the longitudinal magnetic field.

As a result of observing a gate side wall of an FET having a longitudinal gate by use of the electron scanning microscope shown in FIG. 1A while forming the beam tilt lens with the configuration shown in FIG. 1B, an image with high-resolution could be provided.

With the embodiment described above, a charged particle beam apparatus capable of observing and testing a sample with high resolution at a given inclination angle can be provided.

EXAMPLE 2

A second embodiment of the present invention will be described with reference to FIGS. 3 and 4. Those described in the first embodiment but not in this embodiment can be applied to this embodiment unless otherwise is specified. In the second embodiment, an example of configuration of the beam tile lens and its operation will be described.

Figure 3A:
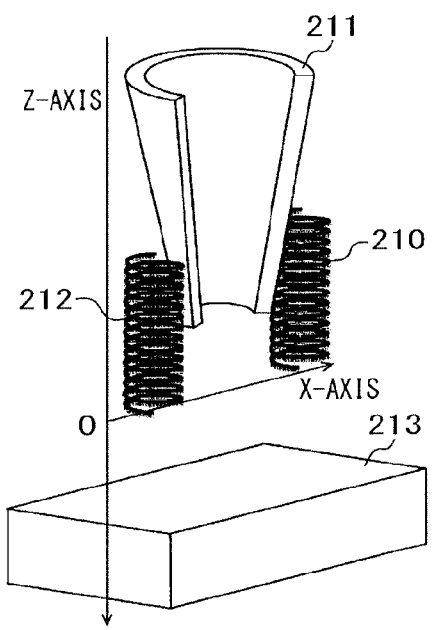
FIG. 3 are perspective views illustrating inner configuration of beam tilt lenses in a charged particle beam apparatus according to a second embodiment and a comparative example, with FIG. 3A showing this embodiment and FIG. 3B showing the comparative embodiment.
Figure 3B:
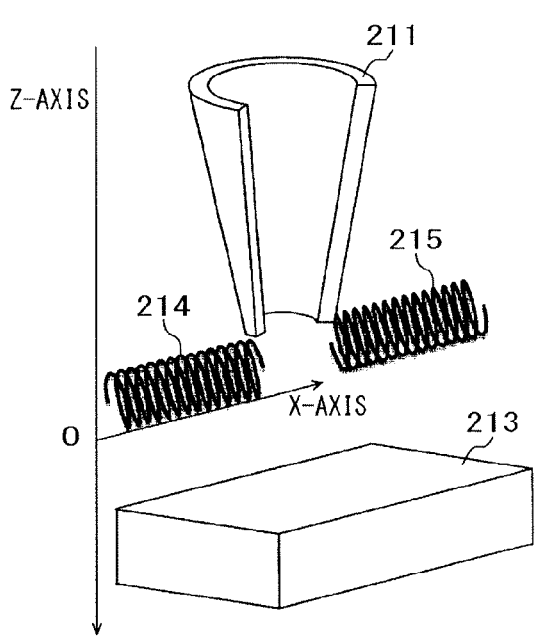

FIG. 3 are perspective views showing pole pieces and solenoid coils at tip end parts on bottom sides of booster magnetic path members, which are inner configuration of beam tilt lenses in charged particle beam apparatuses according to the second embodiment and a comparative example, with FIG. 3A showing this embodiment and FIG. 3B showing a comparative example.

The booster magnetic path member 116 is a cylindrical (or conical) member so formed as to surround an orbit of an electron beam, and as its material, a soft magnetic material is used in many cases. FIG. 3A shows one embodiment of the beam tilt lens of this embodiment. The solenoid coil 210 is a coil which is arranged on an outer side of the pole piece 211 at the tip end part on the bottom side of the booster magnetic path member and which has an insulated conductor spirally wound along a Z-axis. The solenoid coil 210 is arranged with its upper end located above a lower end of the pole piece 211 and with its lower end located below a lower end of the pole piece 211. Further, arranged on an opposite side with a central axis of an orbit of an electron beam in between is another solenoid coil 212. Here, a route of a magnetic flux in a case where the magnetic flux is excited for the two solenoid coils 210 and 212 in mutually vertically opposite directions will be described. The magnetic flux discharged upwardly from the upper end of the solenoid coil 210 forms a closed circuit in which it is absorbed into the pole piece 211 and goes from the upper end to the lower end of the solenoid coil 212 on the opposite side, goes across the orbit of the electron beam on a sample side, and returns to the lower end of the solenoid coil 210.

Here, the lower ends of the solenoid coils 210 and 212 correspond to a lower end of the beam tilt lens and is defined as an original point O of the Z-axis.

There is no component of the beam tilt lens in a region between a bottom side of the original point O and a sample surface 213, which can be used as a work space for position control of the sample. For comparison with this embodiment, FIG. 3B shows an example in which two transverse solenoid coils 214 and 215 are arranged at positions opposing the central axis of the orbit of the electron beam. Both ends of the solenoid coils 214 and 215 having an spirally wound insulated conductor are horizontally located, and bottom side surfaces of the solenoid coils 214 and 215 are defined as an original point O.

Figure 4A:
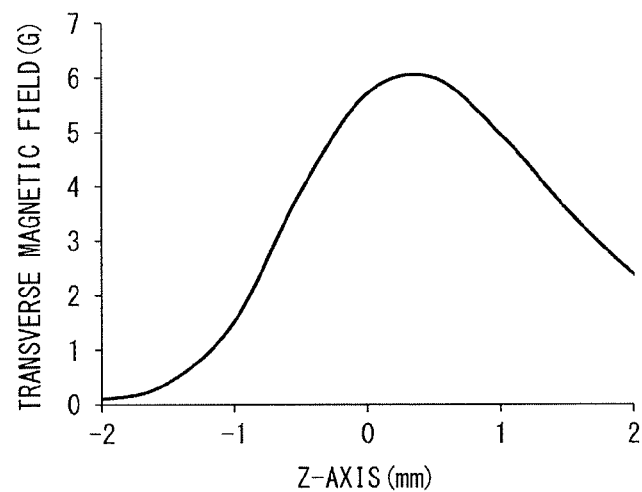
FIG. 4 are diagrams showing solenoid coil comparison of the on-axis magnetic field distribution, with FIG. 4A showing a case of FIG. 3A and FIG. 4B showing a case of FIG. 3B.
Figure 4B:
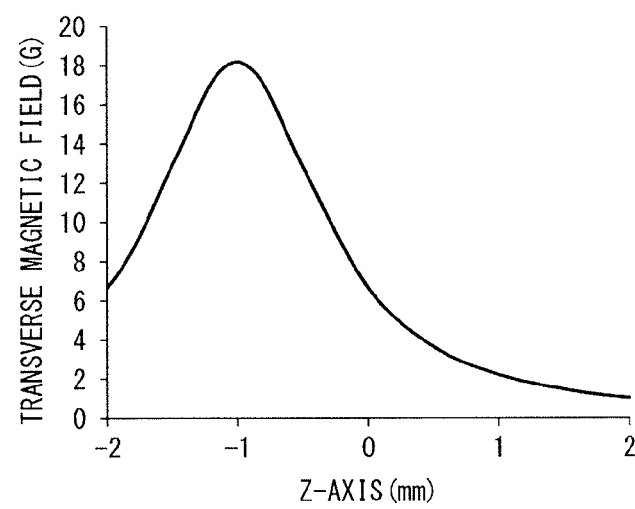

FIG. 4 is a diagram showing Z-axis dependence of on-axis transverse magnetic field distribution when the solenoid coils of FIG. 3 are excited, with FIG. 4A showing a case of FIG. 3A, FIG. 4B showing a case of FIG. 3B.

Here is an example in which an outer diameter of a tip end of the pole piece 211 is φ2 mm, a diameter of the solenoid coil is φ2 mm, and a coil length is 4 mm. The two solenoid coils are so set as to be adjacent to the pole piece and separated in symmetry by 2 mm from the central axis of the orbit of the electron beam. Current is caused to flow through the spirally wound insulated conductors of the two solenoid coils to excite a magnetic field of 10 amperes turn. FIG. 4A shows a case of configuration of a realistic beam tilt lens by use of the pole piece 211 and the solenoid coils 210 and 212 of FIG. 3A. A peak position of the transverse magnetic field is on a positive side with respect to the original point O at the lower ends of the solenoid coils 210 and 212, that is, a sample side. This peak position makes it possible to suppress the transverse magnetic field between the pole piece and the lower ends of the solenoid coils on the negative side with respect to the original point O, and increase the transverse magnetic field in a work space between the lower ends of the solenoid coils and the sample.

In contrast, FIG. 4B shows Z-axis dependence of transverse magnetic field distribution in a case of the configuration of the pole piece 211 and the solenoid coils 214 and 215 of FIG. 3B. Compared to FIG. 4A, a peak position of the transverse magnetic field shifts towards a negative side of a Z-axis by 1 mm or more, that is, separately from the sample towards a pole piece side. As a result, it shows that the transverse field concentrates between the pole piece and lower side surfaces of the solenoid coils, and the transverse magnetic field in the work space relatively decreases. Note that, however, the arrangement of the solenoid coils shown in FIG. 3A is inferior in deflector performance to the arrangement of the solenoid coils shown in FIG. 4B, and thus is not suitable for application to the deflector.

As a result of providing the beam tilt lens with the configuration shown in FIGS. 3A and 3B and observing a gate side wall of an FET having a longitudinal gate by use of the scanning electron microscope shown in FIG. 1A, compared to the case of the configuration of the beam tilt lens of FIG. 3B, the configuration of the FIG. 3A could provide a high-resolution image.

With the embodiment described above, the charged particle beam apparatus capable of observing and testing a sample with high resolution at a given inclination angle can be provided. In particular, arranging the solenoid coils along the Z-axis (optical axis of primary electron beam) can provide favorable results.

EXAMPLE 3

A third embodiment of the present invention will be described with reference to FIGS. 5, 6 and 7. Note that those described in the first and second embodiments but not described in this embodiment can also be applied to this embodiment unless otherwise is specified. Described in the third embodiment an example of arrangement and a shape of a solenoid coil and its operation.

Figure 5:
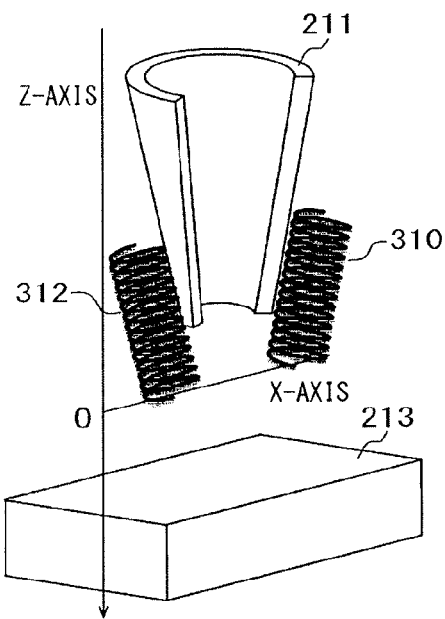
FIG. 5 is a perspective view (partially sectional view) illustrating inner configuration of a beam tilt lens in a charged particle beam apparatus according to a third embodiment.

FIG. 5 is a perspective view (partially sectional view) illustrating inner configuration of a beam tilt lens 113 in a charged particle beam apparatus according to this embodiment, with an arrangement example of solenoid coils 310 and 312 with respect to a pole piece 211 of a booster magnetic path member.

The solenoid coils 310 and 312 are so arranged as to be inclined from a Z-axis along outside inclination of the pole piece 211 of the booster magnetic path member. In a case where the pole piece 211 has a conical shape, inclining the solenoid coils 310 and 312 makes it easier to locate them adjacently to each other. As a result of this inclination, lower ends of the solenoid coils 310 and 312 approaches a central axis of an orbit of an electron beam on a bottom side of the pole piece 211. Also with this configuration, upper ends of the solenoid coils 310 and 312 are arranged above a lower end of the pole piece 211, and lower ends of the solenoid coils 310 and 312 are arranged below the lower end of the pole piece 211. As a result of exciting the solenoid coils 310 and 312 with a magnetic flux oppositely to each other in a vertical direction, the magnetic flux discharged upwardly from the upper end of the solenoid coil 310 is suctioned by the pole piece 211 to go from the upper end of the solenoid coil 312 on the opposite side to the lower end thereof, go across the orbit of the electron beam on a sample side, and return to the lower end of the solenoid coil 310. As shown in FIG. 5, even bending a core of the solenoid coil having the spirally wound insulated conductor with respect to the Z-axis, bringing a side surface of the pole piece 211 and side surfaces of the solenoid coils into a close contact with each other, and making the lowers end of the solenoid coils hop out of the lower end of the pole piece 211 can also create an appropriate transverse magnetic field. Further, a coil length may be extended to connect the upper ends of the solenoid coils 310 and 312 with the side surface of the pole piece 211.

The core of the solenoid coil having the spirally wound insulated conductor is formed into a circle shape by use of, for example, an air core or a non-magnetic material in many cases. A magnetic field excited by the solenoid coil does not become a uniform transverse magnetic field except for the central axis. Thus, when the orbit of the electron beam becomes offset from the central axis due to beam deflection for observation or axial shift of the optical system such as the beam tilt lens, aberration at time of electron beam focusing occurs by the magnetic field of the solenoid coil.

Figure 6:
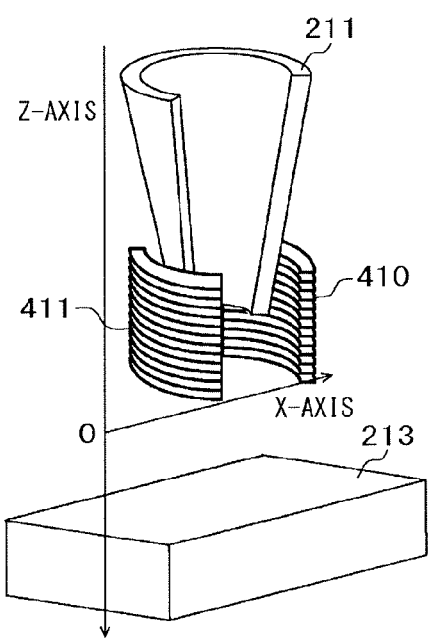
FIG. 6 is a perspective view (partially sectional view) illustrating inner configuration of another beam tilt lens in the charged particle beam apparatus according to the third embodiment.

FIG. 6 is a perspective view (partially sectional view) illustrating inner configuration of another beam tilt lens 113 in the charged particle beam apparatus according to this embodiment, with an example in which a core shape of solenoid coils 410 and 411 is modified into an arch. In this embodiment, forming the fore of the solenoid coils 410 and 411 into an arch shape and changing this core shape permits enlargement of a region of a uniform transverse magnetic field excited by the two arch-shaped solenoid coils 410 and 411. As a result, the aberration occurring at the time of electron beam focusing can be suppressed.

Figure 7:
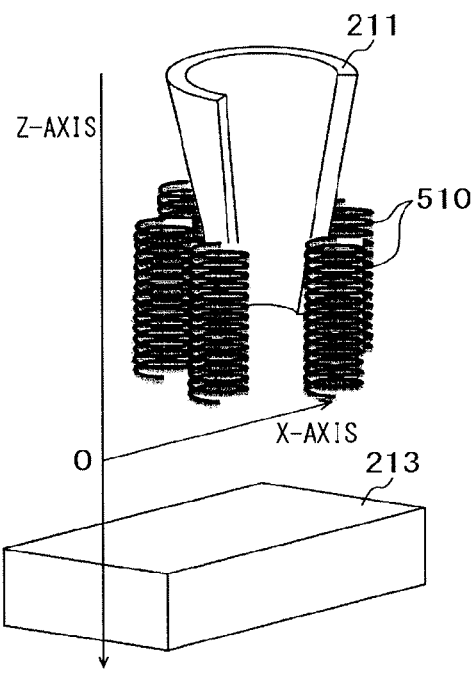
FIG. 7 is a perspective view (partially sectional view) illustrating inner configuration of still another beam tilt lens in the charged particle beam apparatus according to the third embodiment.

FIG. 7 is a perspective view (partially sectional view) illustrating inner configuration of another beam tilt lens 113 in a charged particle beam apparatus according to this embodiment, with an example in which a plurality of solenoid coils 510 are arranged. In this embodiment, the plurality of solenoid coils 510 can be so arranged as to surround the pole piece 211 and the solenoid coils 510 can be excited in a manner such as to be proportional to a COS function for each direction with respect to the central axis whereby a region of the uniform transverse magnetic field can be enlarged. Methods of exciting the solenoid coils 510 in a manner such as to be proportional to the COS function for each direction include: a method of independently controlling current flowing through the solenoid coils 510; and a method of dividing, for wire connection, the solenoid coils 510 into a pair of X and Y perpendicular to the central axis and changing the number of turns for each direction of arrangement. A control circuit and electron beam control have advantages and disadvantages and differences, but can enlarge the region of the uniform transverse magnetic field excited by the solenoid coils 510 and can suppress the aberration occurring at the time of electron beam focusing.

The solenoid coils shown FIGS. 3A, 5, 6, and 7 can form a sharp peak in the transverse magnetic field on a positive side with respect to the original point O as the lower end of the solenoid coil, that is, the sample side by suppressing, through Meissner effect, the magnetic field which leaks from the side surface of the spirally wound insulated conductor as a result of being cooled at −100 degrees Celsius or below and also being covered with a cylindrical member of a super-conductive material or a high-temperature super-conductive material. This peak shape makes it possible to suppress the transverse magnetic field between the pole piece and the lower ends of the solenoid coils on the negative side with respect to the original point O and increase the transverse magnetic field in the work space between the lower ends of the solenoid coils and the sample. As a result, resolution of the beam tilt lens and the tradeoff of the tilt angle rare remarkably improved, permitting high-definition three-dimensional observation in the scanning electron microscope (charged particle scanning microscope).

As a result of providing the beam tilt lens with the configuration shown in FIG. 5 and observing the gate side wall of the FET having a longitudinal gate by use of the scanning electron microscope shown in FIG. 1A, an image with high resolution could be provided.

With this embodiment described above, the charged particle beam apparatus capable of observing and testing a sample with high resolution at a given tilt angle can be provided. Moreover, the solenoid coils can be cooled at −100 degrees Celsius or below and can be covered with a cylindrical member of the superconductive material or a high-temperature superconductive material to thereby achieve high-definition three-dimensional observation.

EXAMPLE 4

A fourth embodiment of the present invention will be described with reference to FIGS. 8 and 9. Note that those described in any of the first to third embodiments but not in this embodiment can also be applied to this embodiment unless otherwise is specified.

Figure 8:
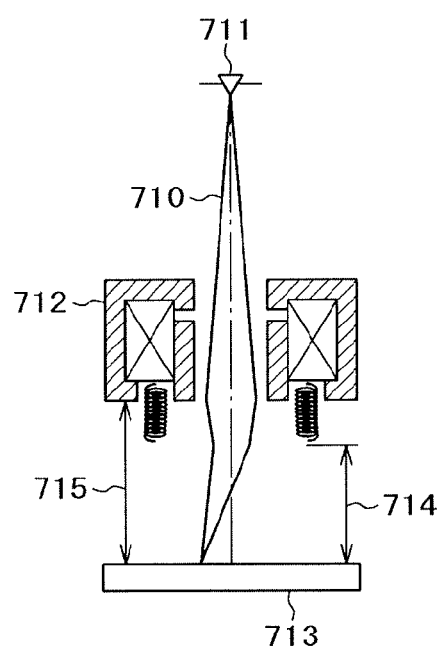
FIG. 8 is a schematic sectional view showing basic configuration of a charged particle beam apparatus according to a fourth embodiment.

FIG. 8 is a minimum configuration diagram of an electron microscope loaded with a beam tilt lens.

It is composed of: an electron source 711 generating a primary electron beam (primary charged particle beam) 710; a beam tilt lens 712 focusing and inclining an electron beam; a sample 713 held on a stage; etc. A work distance 714 is a distance from a lower end of a solenoid coil to an area immediately above the sample 713. In this embodiment, the beam tilt lens 712 has configuration identical to that of FIGS. 3A and 4A, a distance 715 from the lower end of the booster magnetic path member of the beam tilt lens 712 or the lower end of the booster magnetic path member to an area immediately above the sample 713 is 2 mm, and changing them does not bring about a great change in operation effects to be described below.

Tertiary geometric aberrations of Seidel occurring on the beam tilt lens 712 include spherical aberration, coma aberration, on-axis aberration, magnification and rotation chromatic aberration, etc. A probe diameter of the electron beam at this point is:

$$\Delta R = \sqrt{\left(\frac{0.75}{\sqrt{V}\,\alpha}\right)^2 + (C_s \alpha^3)^2 + (C_{D\text{-}COMA}\alpha^2 D)^2 + \left(C_c \frac{\Delta E}{V}\alpha\right)^2 + \left(C_{D\text{-}CHROMATIC}\frac{\Delta E}{V}D\right)^2}$$ [Formula 1]

Here, V denotes landing energy of the electron beam, α denotes a beam aperture angle, $C_S$ denotes a spherical aberration coefficient, $C_{D\text{-}COMA}$ denotes a coma aberration coefficient, $C_C$ denotes an on-axis chromatic aberration coefficient, $C_{D\text{-}CHROMATIC}$ denotes a magnification and rotation chromatic aberration coefficient, D denotes a deflection distance of the electron beam, and ΔE denotes energy dispersion of the electron beam. However, the amount of aberration occurring with respect to a tilt angle in this denotation method is unknown. In case of a beam tilt lens with minimum configuration (FIG. 8), the beam tilt angle depends on the deflection distance. That is, subjecting a beam tilt angle function with the deflection distance D as an argument to Maclaurin exploration provides:

$$T(D)=dT/dD\times D+1/6\times d^3T/dD^3+1/120\times d^5T/dD^5 \quad \text{[Formula 2]}$$

If D is small enough, high-order terms converge and only the first term remains. By using deflection sensitivity of the beam tilt angle as a coefficient of the first term, the tilt coma aberration coefficient is defined as:

$$C_{T\text{-}COMA}=C_{D\text{-}COMA}\div(dT/dD) \quad \text{[Formula 3]}$$

The tilt chromatic aberration coefficient is defined as:

$$C_{T\text{-}CHROMATIC}=C_{D\text{-}CHROMATIC}\div(dT/dD) \quad \text{[Formula 4]}$$

the probe diameter of the electron beam is defined as:

$$\Delta R = \sqrt{\left(\frac{0.75}{\sqrt{V}\,\alpha}\right)^2 + (C_s\alpha^3)^2 + (C_{T\text{-}COMA}\alpha^2 T)^2 + \left(C_c\frac{\Delta E}{V}\alpha\right)^2 + \left(C_{T\text{-}CHROMATIC}\frac{\Delta E}{V}T\right)^2} \quad \text{[Formula 5]}$$

The terms of the tilt comma aberration and the tilt chromatic aberration increase proportionally to the tilt angle, and thus there is trade-off relationship between the probe diameter and the tilt angle. At this point, success in suppressing the tilt comma aberration coefficient and the tilt chromatic aberration coefficient results in improvement in the trade-off of the beam tilt, making it possible to suppress probe diameter deterioration at time of tilting.

Figure 9:
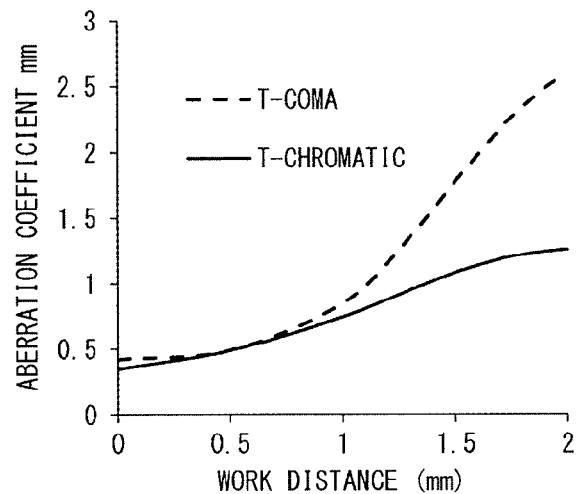
FIG. 9 is a diagram showing dependence of a tilt aberration coefficient on work distance.

FIG. 9 is a diagram showing dependence of the tilt aberration coefficient on the work distance.

A vertical axis denotes an aberration coefficient calculated through electron optical simulation, and a horizontal axis denotes the work distance of the beam tilt lens. A dotted line (T-COMA) denotes the tilt coma aberration coefficient, and a solid line (T-CHROMATIC) denotes the tilt chromatic aberration coefficient. It can be recognized that reducing the work distance 714 can suppress the both aberrations. Here, control is achieved by fixing a distance 715 between a lower end of the booster magnetic path member of the beam tilt lens 712 of FIG. 8 and the sample 713 at 2 mm and changing a position of a lower end of the solenoid coil through a coil length change. For example, when the work distance 714 is 2 mm, the lower end of the solenoid coil and the lower end of the booster magnetic path member agree with each other, and peak positions of the transverse magnetic field and the longitudinal magnetic field almost overlap each other. In contrast, it can be recognized that, when the work distance 714 is 0 mm, the lower end of the solenoid coil and a sample surface agree with each other, resulting in a state in which peak positions of the transverse magnetic field and a longitudinal magnetic field are most remote from each other. That is, the more the peak positions of the transverse magnetic field and the longitudinal magnetic field are separated from each other, the more the tilt coma aberration and the tilt chromatic aberration can be suppressed. Further, suppressing the tilt coma aberration and the tilt chromatic aberration by this embodiment improves the probe diameter and the trade-off of the tilt angle, permitting formation of a tilt electron beam of a small probe diameter at a higher angle.

As a result of providing the beam tilt lens with the configuration shown in FIG. 3A and observing the gate side wall of the FET having a longitudinal gate by changing the work distance by use of the scanning electron microscope shown in FIG. 1A, an image with high resolution can be provided. In particular, setting the work distance at 1 mm or below provides an image with higher resolution.

With this embodiment described above, the charged particle beam apparatus capable of observing and testing a sample with high resolution at a given tilt angle can be provided. Moreover, setting the work distance at 1 mm or below makes it possible to more reduce the aberrations and form a tilt electron beam (charged particle beam) of a small probe diameter at a higher angle.

EXAMPLE 5

A fifth embodiment of the present invention will be described with reference to FIGS. 10 and 11. Those described in any of the first to fourth embodiments but not described in this embodiment can also be applied to this embodiment unless otherwise specified.

Figure 10:
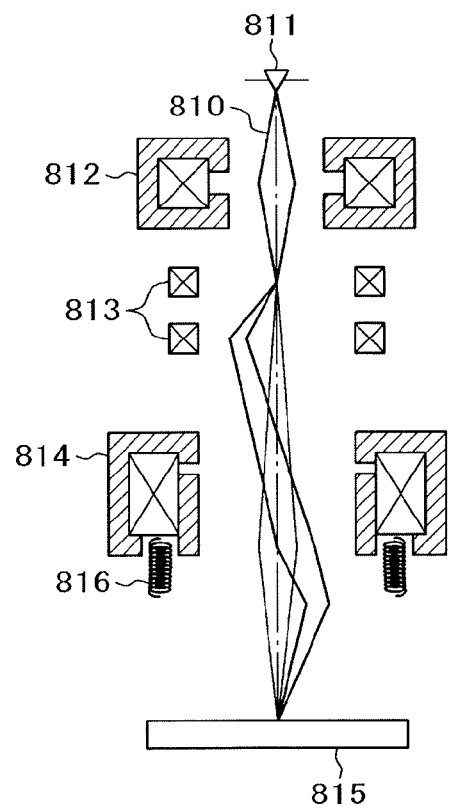
FIG. 10 is a schematic sectional view showing basic configuration of a charged particle beam apparatus (with an additional deflector) according to a fifth embodiment.

FIG. 10 is a schematic sectional view showing basic configuration of an electron microscope according to this embodiment loaded with a beam tilt lens and a deflector in combination.

This electron microscope is composed of: an electron source 811 generating a primary electron beam (primary charged particle beam) 810; a condenser lens 812 focusing the primary electron beam 810; a deflector 813 deflecting the primary electron beam 810; a beam tilt lens 814 focusing and inclining the primary electron beam 810; a stage (not shown) holding a sample 815; etc. The deflector 813 is provided in two stages in this embodiment, whereby an inclination angle and axis separation of the primary electron beam 810 upon its arrival on the beam tilt lens 814 can be controlled. This makes it possible to suppress tilt coma aberration and tilt chromatic aberration by aberration occurring on a route of the electron beam before arriving at a solenoid coil 816.

Loading the deflector 813 in the two stages as in this embodiment permits deflection of the beam while maintaining the beam tilt angle. However, aberrations occurring at the beam tilt lens 814 and occurring through beam deflection with the deflector 813 are not independent from each other, and cross term needs to be considered in some cases in order to achieve both beam tilt control and beam deflection control. As described above, combination with the deflector 813 can strengthen a function of the beam tilt lens 814. Note that, however, the number of stages of the deflector 813 in this embodiment is not limited to two, and thus a different number of stages can also have an equivalent function.

Figure 11:
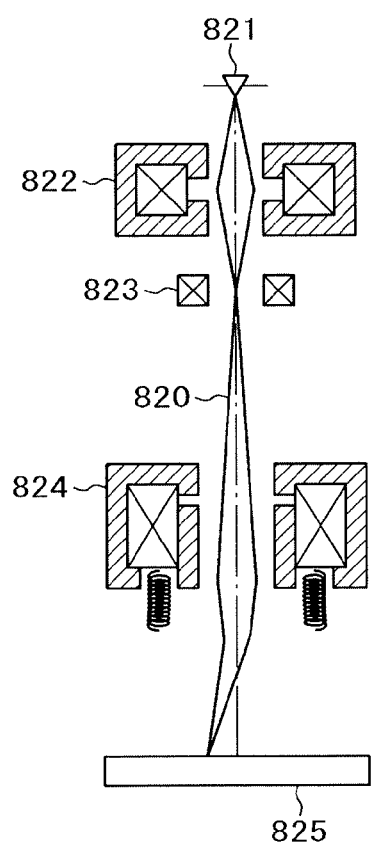
FIG. 11 is a schematic sectional view showing basic configuration of the charged particle beam apparatus (with an additional aberration corrector) according to the fifth embodiment.

FIG. 11 is a schematic sectional view of another electron microscope according to this embodiment combining a beam tilt lens with an aberration corrector.

This electron microscope is composed of: an electron source 821 generating a primary electron beam (primary charged particle beam) 820; a condenser lens 822 focusing the primary electron beam 820; an aberration corrector 823 correcting the primary electron beam 820; a beam tilt lens 824 focusing and inclining the primary electron beam 820; a stage (not shown) holding a sample 825; etc. The aberration corrector 823 creates tilt coma aberration, tilt chromatic aberration, etc. in the primary electron beam 820. The aberration corrector 823 is formed of multi-poles and a lens of an electric field and a magnetic lens. For example, to form the tilt chromatic aberration, an aberration corrector is effective which can form a Wien filter in a given direction by an electric pole and a magnetic pole formed of, for example, four poles, eight poles, 12 poles, or 20 poles. That is, an aberration that is inverse to the tilt coma aberration and the tilt chromatic aberration occurring upon simultaneous control of the beam focusing and the beam tilting with the beam tilt lens 824 is generated by the aberration corrector 823 to cancel the aberrations. This permits suppression of the tilt coma aberration and the tilt chromatic aberration of the beam tilt lens, improvement of the probe diameter and the tradeoff of the tilt angle to form a tilt electron beam of a small probe diameter at a higher angle.

Combining the deflector shown in FIG. 10 with the aberration corrector shown in FIG. 11 makes it possible to not only improve the probe diameter and the tradeoff of the tilt angle but also control the beam deflection and the tilt angle independently from each other.

As a result of providing the beam tilt lens with the configuration shown in FIG. 3A and observing a gate side wall of an FET having a longitudinal gate by use of a scanning electron microscope shown in FIGS. 10 and 11, an image with high resolution could be provided. Note that a beam tilt lens having different configuration can also be used.

With the embodiment described above, the charged particle beam apparatus capable of observing and testing a sample with high resolution at a given tilt angle. Moreover, combining the beam tilt lens with the deflector permits suppression of the tilt coma aberration and the tilt chromatic aberration. Moreover, combining the beam tilt lens with the aberration corrector permits formation of a tilt electron beam of a small probe diameter at a higher angle. Further, combining the beam tilt lens, the deflector, and the aberration corrector makes it possible to control the beam deflection and the tilt angle independently from each other.

EXAMPLE 6

With reference to FIGS. 12 to 15, an example excluding the inner configuration of the beam tilt lens 113 shown in FIG. 1B will be described in detail. In the figure, together with the inner configuration of the beam tilt lens 113, a measured and tested sample 114 is shown. Those described in any of the first to fifth embodiments but not described in this embodiment can also be applied to this embodiment unless otherwise specified.

Figure 12:
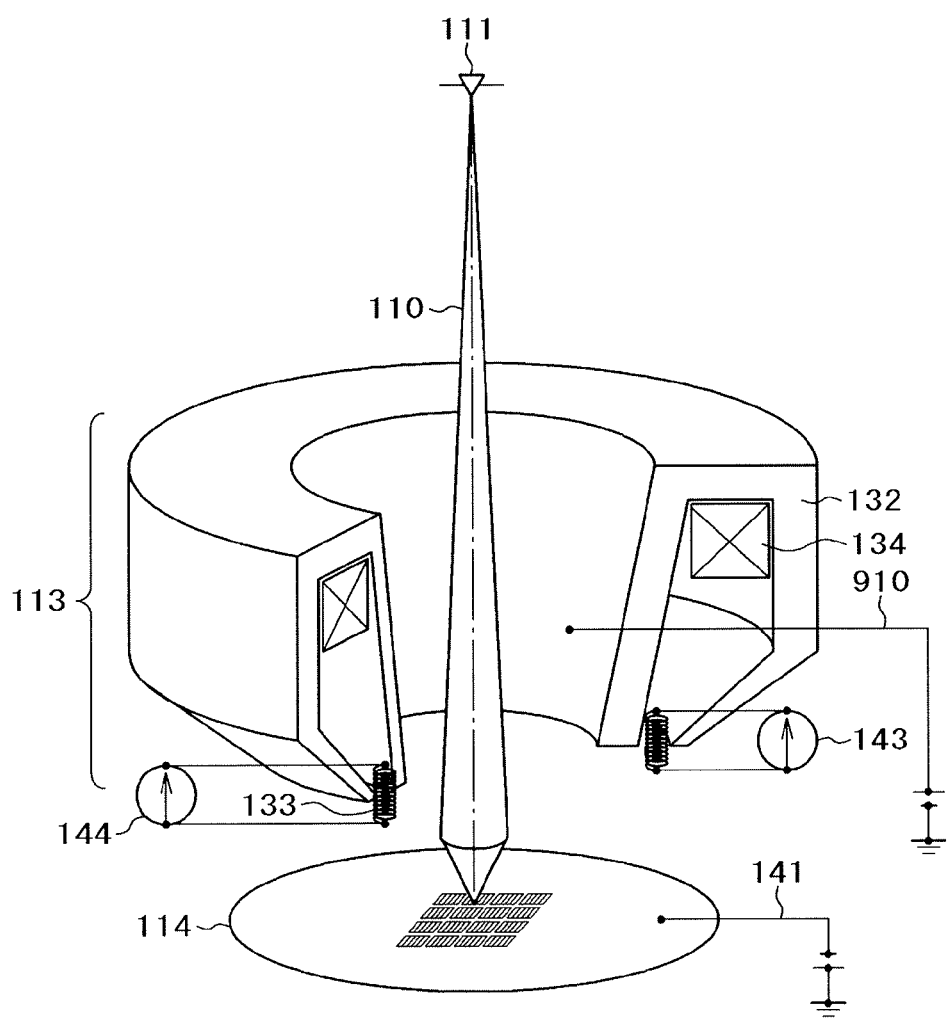
FIG. 12 is a schematic perspective view (partially including a cross-section) showing basic configuration of a charged particle beam apparatus (with minimum configuration) according to a sixth embodiment.

FIG. 12 shows the beam tilt lens 113 with minimum configuration which is a simpler example than that of FIG. 1B. This beam tilt lens 113 is configured to include at least: a yoke magnetic path member 132 arranged around an optical axis of a primary electron beam (or a central axis of an electron optical system 102); a plurality of (two or more) solenoid coils 133 provided in a donut-shaped closed space formed by the yoke magnetic path member 132 and a sample 114; and a lens coil 134. The optical axis of the primary electron beam or the central axis of the electron optical system 102 is so formed as to agree with a central axis of the beam tilt lens 113 or the vacuum housing 101 in many cases. A lower end of the solenoid coils 133 is arranged between a pole piece tip of the yoke magnetic path member 132 and the measured and the sample 114, and an upper end of the solenoid coils 133 is arranged on a side surface of the yoke magnetic path member 132. For the solenoid coils 133, the one having an insulated conductor spirally wound so as to avoid leakage of the magnetic field between the aforementioned upper end and the aforementioned lower end of the solenoid coils 133 from the side surface. Note that instead of the solenoid coil having the insulated conductor spirally wound around an air core or a core of a non-magnetic material, a coil fabricated in a way of winding other than the spiral winding may be used. Moreover, the solenoid coil can be fixed to the yoke magnetic path member with the non-magnetic material.

The yoke magnetic path member 132 is formed of an annular member having hollow inside, and has a sectional surface formed into a trapezoid shape having a slope surface on a surface side opposing the optical axis of the primary electron beam. On the beam tilt lens 113 of this embodiment, the yoke magnetic path member 132 is arranged in a manner such that the optical axis of the primary electron beam passes through a center of the annular member. Inside the yoke magnetic path member 132 of the annular member, the lens coil 134 is held, and a magnetic flux for focusing the primary electron beam 110 by the lens coil 134 is excited. Provided on an inner surface side (surface side opposing the primary electron beam) at a bottom of this trapezoid shape, by which the excited magnetic flux forms a closed magnetic path in the yoke magnetic path member 132. Moreover, provided on a top surface side of the yoke magnetic path member 132 (in a direction in which the primary electron beam enters) and a bottom surface side thereof (in a direction in which the primary electron beam exits) is an aperture through which the primary electron beam passes. Moreover, as a material of the yoke magnetic path member 132, a soft magnetic material is used. Note that the annular member having a sectional surface formed into a trapezoid shape is used, but the shape of the yoke magnetic path member 132 is not specified as long as it fulfills the function of passing the excited magnetic flux over between the pole piece of the yoke magnetic path member 132 and a gap. For example, the sectional surface of the yoke magnetic path member may be U-shaped.

The yoke magnetic path member 132 has a cylindrical (or conical) shape provided along an inner surface side (a region surrounding the primary electron beam), and is arranged inside the beam tilt lens in a manner such that the central axis of the cylinder agrees with the optical axis of the primary electron beam (or the central axis of the vacuum housing 101). As its material, a soft magnetic material is used. A tip end part on a bottom side of the cylinder (a tip end part on a side opposing the sample) forms a pole piece on which a magnetic flux excited by the lens coil 134 is focused.

Arranged on a bottom surface side of the yoke magnetic path member 132 are the solenoid coils 133. The solenoid coils 133 is a coil having a spirally wound insulated conductor so arranged as to surround the pole piece of the aforementioned yoke magnetic path member at a central part. The yoke magnetic path member 132 is arranged inside the beam tilt lens in a manner such as to be coaxial with respect to the optical axis of the primary electron beam. An aperture end part on a bottom side of the yoke magnetic path member 132 forms a magnetic pole on which the magnetic flux is focused, and focusing of the magnetic flux in a gap between the pole pieces of the yoke magnetic path member 132 can bring about a stronger lens effect with respect the primary electron beam than the conventional one. The pole piece belonging to a central portion of the yoke magnetic path member 132 may be called an upper pole piece, and the pole piece belonging to outside of the yoke magnetic path member may be called a lower pole piece. The two pole pieces of the yoke magnetic path member 132 are coupled to each other in a magnetically strong manner, and the magnetic flux excited by the lens coil 134 flows through the aforementioned yoke magnetic path member.

The yoke magnetic path member 132 is held at a grounding potential in many cases, but a potential applied to the yoke magnetic path member 132 will be described. The yoke magnetic path member 132 and the electro optical system 102 may be electrically insulated from each other through an insulated material. Here, supplied to the yoke magnetic path member 132 is a potential which becomes positive with respect to the potential of the electron optical system 102 and which is identical to that of the aforementioned acceleration electrode 131 or has a positive potential difference therefrom. This potential is supplied by a yoke power source 910. Thus, the primary electron beam 110 passes through the aforementioned yoke magnetic path member 132 while most accelerated on an orbit of the primary electron beam 110 by a potential difference between the acceleration electrode 131 and the yoke magnetic path member 132.

Also for the charged particle beam apparatus of this embodiment, the retarding method may be adopted. Here, a deceleration electric field is formed between the beam tilt lens and the sample. Supplied to the solenoid coils 133 is current for exciting a transverse magnetic field, its current is supplied by the solenoid coil power sources 143 and 144. Moreover, applied to the stage 140 (not shown) is a potential which has a negative difference from that of the yoke magnetic path member 132. Thus, the primary electron beam 110 that has passed through the yoke magnetic path member 132 arrives at a surface of the suddenly decelerated measured and tested sample 114. Here, landing energy of the primary beam (primary electron beam 110) is determined by only a potential difference between the electron source 111 and the stage 140, and thus controlling the potential applied to the electron source 111 and the stage 140 at predetermined values makes it possible to control the landing energy at a desired value regardless of what potential is applied to the yoke magnetic path member 132 and the acceleration electrode 131. Therefore, setting the potential, which has been applied to the acceleration electrode 131 and the yoke magnetic path member 132, positive with respect to that of the electron source 111 permits passage of the primary electron beam 110 through the electron optical system 102 at a high speed, which can decrease the probe size of the primary electron beam 110 on the sample.

Figure 13:
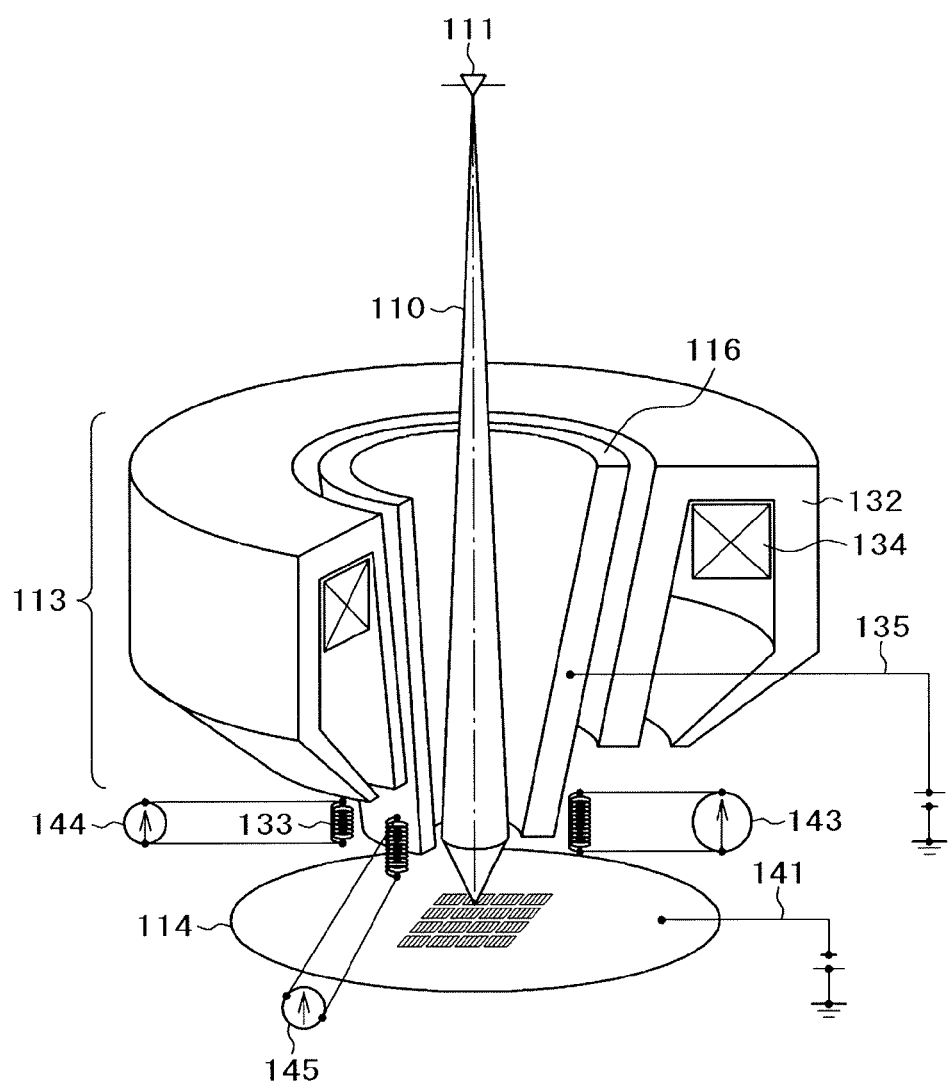
FIG. 13 is a schematic perspective view (partially including a cross-section) showing basic configuration of another (slimed) charged particle beam apparatus according to the sixth embodiment.

FIG. 13 shows an example in which the pole piece and the solenoid coil of the booster magnetic path member are changed to form a slim beam tilt lens of FIG. 1B. The booster magnetic path member 116 is a cylindrical (or conical) member provided along an inner surface side of the annular member forming the yoke magnetic path member 132 (region opposing the primary electron beam 110), and is arranged inside the beam tilt lens 113 in a manner such that a central axis of the cylinder agrees with the optical axis of the primary electron beam (or central axis of the vacuum housing 101). As its material, a soft magnetic material is used as is the case with the yoke magnetic path member 132. A tip end on a bottom side of the cylinder (a tip end part on a side opposing the sample) projects towards the sample surface, forming a pole piece on which the magnetic flux excited by the lens coil 134 is focused. A plurality of (two or more) solenoid coils 133 are provided on an outer side of the pole piece of the booster magnetic path member 116 arranged around the optical axis of the primary electron beam. A lower end of this solenoid coils 133 is arranged between the tip end part of the pole piece of the booster magnetic path member 116 and the sample 114, and an upper end of the solenoid coils 133 is arranged on a side surface of the booster magnetic path member 116. Used as the solenoid coils 133 is the one which has a spirally wound electric wire so that the magnetic field between the aforementioned upper end and the aforementioned lower end of the solenoid coils 133 does not leak from the side surface. The central axis of the primary electron beam or the central axis of the electron optical system 102 is so configured in many cases as to agree with the central axis of the beam tilt lens 113 or the vacuum housing 101. A space between the yoke magnetic path member 132 and the sample 114 can be increased, which permits inclination of the sample 114. This consequently makes it possible to perform dimensional sample observation by varying a sample posture.

Figure 14:
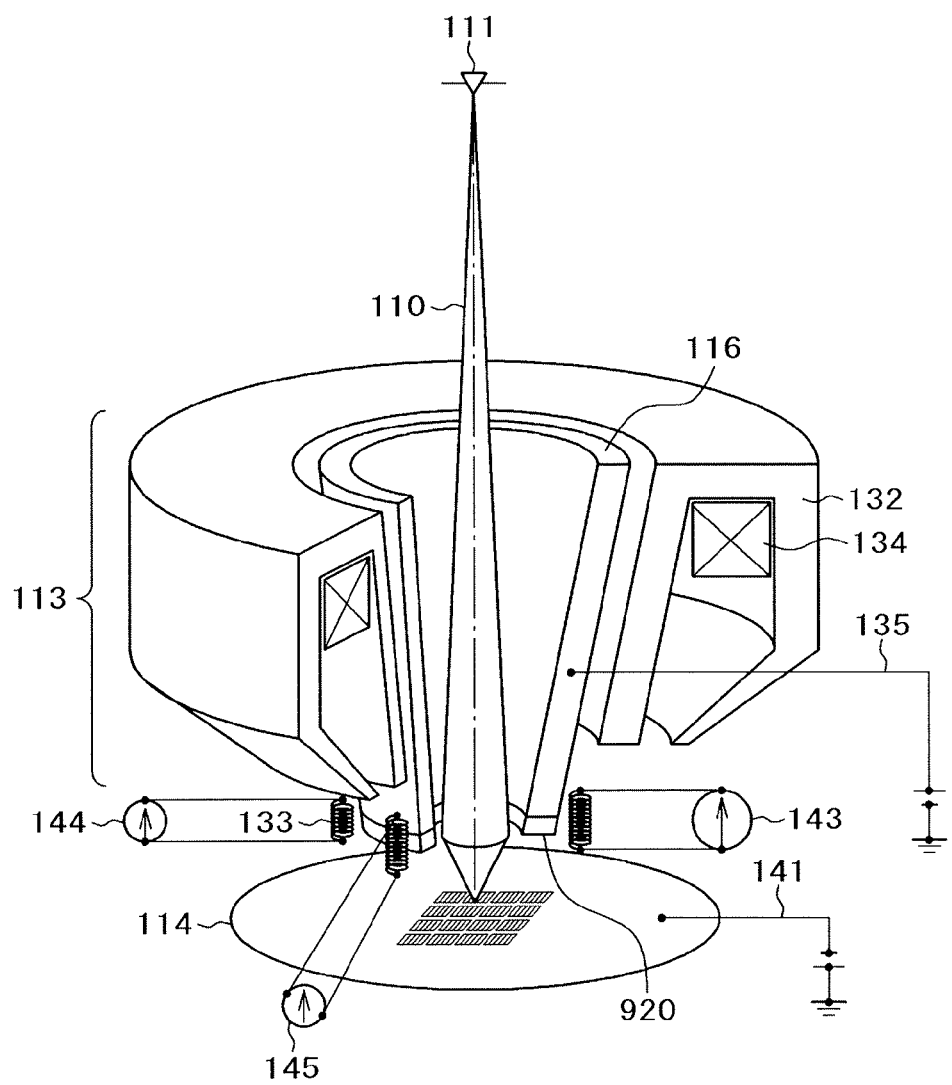
FIG. 14 is a schematic perspective view (partially including a cross-section) showing basic configuration of another charged particle beam apparatus (with an additional shield electrode) according to the sixth embodiment.

FIG. 14 shows an example in which a shield electrode is added to the tip end of the pole piece of the booster magnetic path member of FIG. 1B. The booster magnetic path member 116 is a cylindrical (or conical) member provided along the inner surface side of the annular member forming the yoke magnetic path member 132 (region opposing the primary electron beam 110), and is arranged in a manner such that the central axis of the cylinder agrees with the optical axis of the primary electron beam (or the central axis of the vacuum housing 101). Used as its material is a soft magnetic material, as is the case with the yoke magnetic path member 132. The tip end part on the bottom side of the cylinder part of this yoke magnetic path member 132 forms a pole piece on which the magnetic flux excited by the lens coil 134 concentrates, and at the tip end part of the pole piece of the yoke magnetic path member 132, a shield electrode 920 is arranged which projects towards the surface of the sample 114. This shield electrode 920 is a member of non-magnetic metal formed into a cylindrical (conical) shape, is arranged in a manner such that the central axis of the cylinder agrees with the optical axis of the primary electron beam (or the central axis of the vacuum housing 101). A plurality of (two or two) solenoid coils 133 are provided on an outer side of the pole piece of the booster magnetic path member 116 arranged around the optical axis of the primary electron beam. A lower end of the solenoid coil 133 is arranged on a side surface of the shield electrode 920, and an upper end of the solenoid coil 133 is arranged on a side surface of the booster magnetic path member 116. Used as the solenoid coil 133 is the one which has an electric wire spirally wound so that the magnetic field between the aforementioned upper end and the aforementioned lower end does not leak from the side surface. Providing the shield electrode 920 can avoid hitting between the sample 114 and the solenoid coils 133 at time of coordinate control of the sample 114 and can also avoid hitting between a secondary electron discharged from the sample 114 and the solenoid coil. This consequently further improves resolution of the beam tilt lens and the tradeoff of the tilt angle and also permits high-definition inclination observation of the sample.

Figure 15:
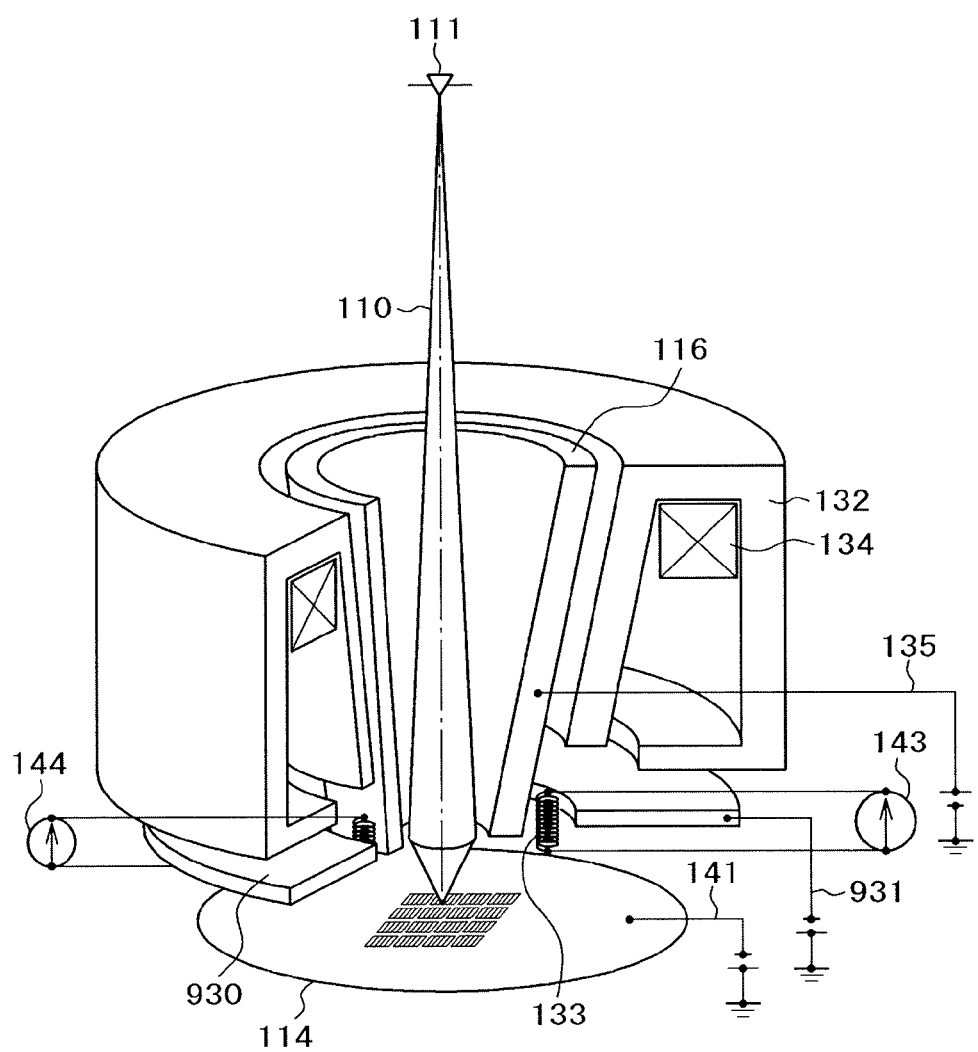
FIG. 15 is a schematic perspective view showing basic configuration of another charged particle beam apparatus (with an additional control magnetic path member) according to the sixth embodiment.

FIG. 15 shows an example in which a control magnetic path member is added to the yoke magnetic path member. This beam tilt lens 113 is so configured as to include at least: a yoke magnetic path member 132 arranged around the optical axis of the primary electron beam (or the central axis of the electron optical system 102); a booster magnetic path member 116 provided in a space between the yoke magnetic path member 132 and the optical axis of the primary electron beam; three magnetic path members including control magnetic path members 930 arranged in a closed space formed by a bottom surface of the yoke magnetic path member 132 and the sample 114; a lens coil 134; and a plurality of (two or more) solenoid coils 133 provided in a donut-shaped closed space formed by the booster magnetic path member 116, the control magnetic path members 930, and the sample 114. The optical axis of the primary electron beam or the central axis of the electron optical system 102 is so configured in many cases as to agree with the central axis of the beam tilt lens 113 or the vacuum housing 101. A lower end of the solenoid coil 133 is arranged between a tip end part of the booster magnetic path member 116 and the sample 114, and an upper end of the solenoid coil 133 is arranged between the booster magnetic path member 116 and the control magnetic path member 930. Used as the solenoid coil 133 is the one which has a spirally wound electric wire so that a magnetic field between the aforementioned upper end and the aforementioned lower end does not leak from the side surface.

The yoke magnetic path member 132 of FIG. 15 is formed of an annular member whose inside is hollow, and has a sectional surface formed into a trapezoid shape having a slope surface on a surface side opposing the optical axis of the primary electron beam. On this beam tilt lens 113, the yoke magnetic path member 132 is arranged in a manner such that the optical axis of the primary electron beam passes through a center of the annular member. Arranged inside the yoke magnetic path member 132 of the annular member is the lens coil 134, by which a magnetic flux for focusing the primary electron beam 110 is excited. Provided on an inner surface side of a bottom of this trapezoid shape (surface side opposing the primary electron beam) is a space, by which the excited magnetic flux flows to the booster magnetic path member 116 and the control magnetic path members 930 without forming a closed magnetic path in the yoke magnetic path member 132. Moreover, on a top surface side (in a direction in which the primary electron beam enters) and a bottom surface side (in a direction in which the primary electron beam exits) of the yoke magnetic path member 132, an aperture is included through which the primary electron beam passes. Moreover, used as a material of the yoke magnetic path member is a soft magnetic material. Note that as the yoke magnetic path member 132 shown in FIG. 15, the annular member having a trapezoid-shaped sectional surface is used, but the shape of the yoke magnetic path member 132 is not specified as long as it fulfills the function of passing the excited magnetic flux to the booster magnetic path member 116 and the control magnetic path members 930. For example, the sectional surface of the yoke magnetic path member 132 may be U-shaped.

Next, potentials applied to the booster magnetic path member 116, the yoke magnetic path member 132, and the control magnetic path members 930 will be described. The booster magnetic path member 116, the yoke magnetic path member 132, and the control magnetic path members 930 are electrically insulated from each other via an insulated material. Supplied to the booster magnetic path member 116 is a potential which becomes positive with respect to the potential of the yoke magnetic path member 132 and which has a positive difference with respect to the potential of the aforementioned acceleration electrode 131. This potential is supplied by a booster power source 135. Moreover, the yoke magnetic path member 132 is held at a grounding potential. Thus, the primary electron beam 110 passes through the aforementioned booster magnetic path member 116 while most accelerated on the orbit of the primary electron beam 110 by a potential difference between the acceleration electrode 131 and the booster magnetic path member 116.

Also for the charged particle beam apparatus of this embodiment, the retarding method is adopted. In this case, a deceleration electrode is formed between the beam tilt lens and the sample. Supplied to the control magnetic path members 930 is such a potential that has a negative difference from that of the yoke magnetic path member 132, and this potential is supplied by a control magnetic path power source 931. Supplied to the solenoid coil 133 is current for exciting the transverse magnetic field, and this current is supplied by solenoid coil power sources 143 and 144. Moreover, applied to the stage 140 (not shown) holding the sample 114 by a stage power source 141 is a potential that has a negative difference from that of the booster magnetic path member 116. Thus, the primary electron beam 110 that has passed through the booster magnetic path member 116 arrives at the surface of the suddenly decelerated sample 114. Here, landing energy of the primary electron beam 110 is determined by only a potential difference between the electron source 111 and the stage 140, and thus controlling the potentials applied to the electron source 111 and the stage 140 at predetermined values makes it possible to control the landing energy at a desired value regardless of what potentials are applied to the booster magnetic path member 116 and the acceleration electrode 131. Therefore, setting the potentials applied to the acceleration electrode 131 and the booster magnetic path member 116 positively with respect to the electron source 111 permits passage of the primary electron beam 110 through the electron optical system 102 at high speed, and can reduce the probe size of the primary electron beam 110 on the sample.

Figure 16:
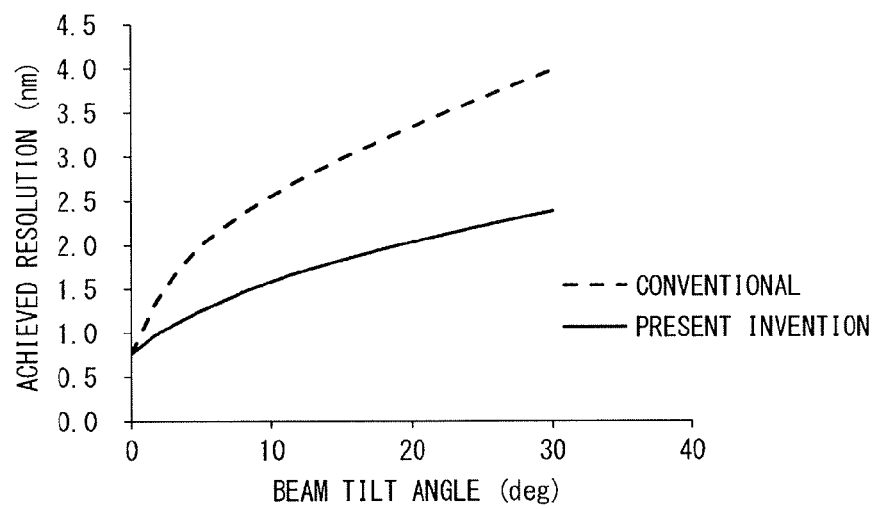
FIG. 16 is a diagram comparing beam tilt angle dependence of achieved resolution between a conventional method and each of the embodiments of the present invention.

FIG. 16 is a diagram comparing dependence of arrived resolution on the beam tilt angle between a conventional method and each of the embodiments. Compared to the conventional method combining a deflector with an objective lens, in the beam tilt lens in each of the embodiments of the present invention, for an electron beam of 5 kV, the amount of deterioration in resolution decreases by half. With a beam tilt angle of 10 degrees, the resolution improves from 2.5 nm to 1.5 nm, which permits observation of a wiring of 10 nm.

Figure 17:
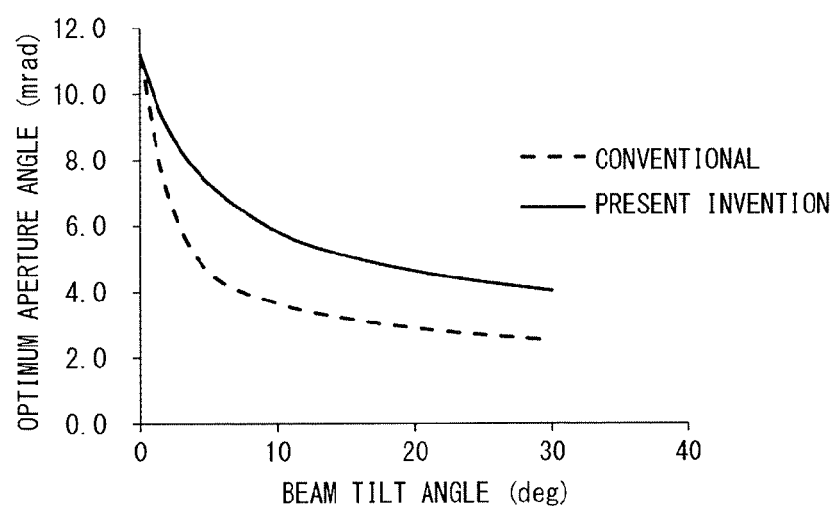
FIG. 17 is a diagram comparing the beam tilt angle dependence of an optimum aperture angle between the conventional method and each of the embodiments of the present invention.

FIG. 17 is a diagram comparing dependence of an optimum aperture angle on a beam tilt angle between the conventional method and each of the embodiments. Compared to the conventional method, the tilt coma aberration coefficient and the tilt chromatic aberration coefficient are smaller, thus permitting an increase in the optimum aperture angle.

The present invention has been described above, and main modes of the present invention will be listed below.

(1) In a charged particle beam apparatus irradiating a primary charged particle beam to a sample loaded on a stage to detect secondary charged particles generated by the irradiation, the charged particle beam apparatus includes a beam tilt lens having a function of focusing the primary charged particle beam on the sample and inclining the primary charged particle beam on the sample arbitrarily. Further, the beam tilt lens is an annular member with a hollow inside provided along a region surrounding the primary charged particle beam, has a gap of a pole piece at an aperture end of a tip part on a bottom side as a side opposing a sample, further includes: a yoke magnetic path member characterized by having a coil therein;

a solenoid coil arranged in such a manner as to surround the pole piece at the central aperture end of the yoke magnetic path member from outside;

a lens coil power source controlling a focus position of the primary charged particle beam; and a solenoid coil power source controlling an inclination angle of the primary charged particle beam, and the solenoid coil is a solenoid coil having an insulated conductor spirally wound around an air core or a core of a non-magnetic material where an upper end is on a side surface of the yoke magnetic path member and a lower end is between a tip of the pole piece of the yoke magnetic path member and the sample.

Between the beam tilt lens and the sample, a magnetic force line directed along the central axis is a longitudinal magnetic force, and a magnetic force line directed perpendicularly to the central axis is a transverse magnetic field.

The longitudinal magnetic field is excited by the lens coil in the tilt lens, and is induced to the pole piece tip of the yoke magnetic path member. Thus, a peak is located immediately below the pole piece tip, and a peak shape is vertically asymmetrical. In contrast, the transverse magnetic field is excited by the solenoid coil. It is important to form the solenoid coil with an air core or a non-magnetic core so as not to disturb the longitudinal magnetic field. A peak position of the transverse magnetic field excited by the solenoid coil is formed on a sample side located below a peak position of the longitudinal magnetic field. Thus, projecting the lower end of the solenoid coil more closely towards the sample side than the pole piece tip can separate the peak positions of the transverse magnetic field and the longitudinal magnetic field from each other.

The more the peak positions of the transverse magnetic field and the longitudinal magnetic field are separated from each other, the more the tilt coma aberration and the tilt chromatic aberration can be suppressed, which therefore permits an improvement in the probe diameter and the tradeoff of the tilt angle to form a tilt electron beam of a small probe diameter at a higher angle.

(2) Further, in the charged particle beam apparatus as described in (1), provided is a booster magnetic path member of a cylindrical or conical shape provided along an inner surface side of the annular member forming the yoke magnetic path member, formed at tip parts of the yoke magnetic path member and the booster magnetic path member on the bottom side as the side opposing the sample is a gap of a pole piece on which a magnetic flux excited by the coil concentrates, provided is a booster power source maintaining the yoke magnetic path member at a grounding potential and supplying a positive potential to the booster magnetic path member, the solenoid coil is arranged in a manner such as to surround the pole piece of the booster magnetic path member where an upper end is on an outer side surface of the booster magnetic path member and a lower end is between the pole piece tip of the booster magnetic path member and the sample, which further can improve the probe diameter and the tradeoff of the tilt angle to form a tilt electron beam of a small probe diameter at a higher angle.

(3) Further, in the charged particle beam apparatus as described in (1) or (2), a stage power source maintaining the yoke magnetic path member at a grounding potential and supplying a negative potential to the stage and a function of controlling landing energy at a desired value by the potential applied to the stage are provided, which can dramatically improve the probe diameter and the tradeoff of the tilt angle to form a tilt electron beam of a small probe diameter at a higher angle.

A shape and arrangement of the solenoid coil will be described below.

(4) Further, in the charged particle beam apparatus as described in any of (1) to (3), the pole piece at the central aperture end is formed into a conical shape, which permits suppression of on-axis aberration. Here, tilting the solenoid coil in a manner such that its lower end approaches the central axis on the bottom side of the pole piece to thereby locate it adjacently to the pole piece can enlarge an inter-peak distance between the transverse magnetic field and the longitudinal magnetic field, and can improve the probe diameter and the tradeoff of the tilt angle to form a tilt electron beam of a small diameter at a higher angle.

(5) Further, in the charged particle beam apparatus as described in any of (1) to (3), two solenoid coils are provided which is obtained by bending a core of the spirally closely wound solenoid coils for extension, connecting upper ends of the two solenoid coils with a side surface of the pole piece, and projecting them from a lower end of the pole piece towards the sample side.

(6) Further, in the charged particle beam apparatus as described in any of (1) to (3), an air core of the solenoid coil or a core of a non-magnetic material is modified into an arch shape.

(7) In the charged particle beam apparatus as described in any of (1) to (3), a plurality of solenoid coils are arranged in a manner such as to surround the pole piece, and a solenoid coil power source is provided in a manner such as to be proportional to a COS function for each direction with respect to a central axis.

(8) In the charged particle beam apparatus as described in any of (1) to (3), having the plurality of solenoid coils arranged in a manner such as to surround the pole piece, and coupled together in a manner such as to be divided into a pair of X and Y perpendicular to the central axis separately in sets of X and Y perpendicular to the central axis by changing a number of turns so that the solenoid coils are proportional to a COS function for each direction of arrangement.

(9) In the charged particle beam apparatus as described in any of (1) to (3), the solenoid coil is cooled to −100 degrees Celsius or below and is covered with a cylindrical member of a superconductive material or a high-temperature superconductive material.

(10) In the charged particle beam apparatus as described in any of (1) to (3), using a beam tilt technology of suppressing tilt coma aberration and tilt chromatic aberration by efficiently separating peak positions of a transverse magnetic field excited by the solenoid coil and a longitudinal magnetic field excited by the lens coil.

Adoption of a solenoid coil and a tilt lens as described above can improve the probe diameter and the tradeoff of the tilt angle to form a tilt electron beam of a small probe diameter at a higher angle.

Examples of electron optical application of the beam tilt lens are shown below.

(11) Further, in the charged particle beam apparatus as described in any of (1) through (3), combining the beam tilt lens and the condenser lens with the deflector permits independent control of a deflection position in addition to an angle and a direction of inclination. This consequently simplifies control of stage movement of sample coordinates, and permits high-speed correction through deflection position control.

(12) Further, in the charged particle beam apparatus as described in any of (1) through (3), the beam tilt lens, the condenser lens, and an aberration corrector can be combined together to cancel aberration of the beam tilt lens by aberration created by the aberration corrector.

(13) Further, in the charged particle beam apparatus as descried in any of (1) through (3), Provided at a tip part of the pole piece of the beam tilt lens is a shield electrode of non-magnetic metal projecting towards a sample surface, which permits avoidance of hitting of the secondary electron at the solenoid coil. This consequently can suppress effect of charging of, for example, the solenoid coil and can also avoid a drift of the primary electron beam and a yield change of the secondary electron.

(14) Further, in the charged particle beam apparatus as described in (3), the beam tilt lens is provided with a control magnetic path member in a closed space formed by a bottom surface of the yoke magnetic path member and the sample, the yoke magnetic path member, the control magnetic path member, and the booster magnetic path member are electrically insulated from each other via an insulated material, and the yoke magnetic path member is maintained at a grounding potential, and a control magnetic path power source applying a negative potential to the control magnetic path member is provided.

Adoption of configuration of the tilt lens as described above can improves the probe diameter and the tradeoff of the tilt angle, and can form a tilt electron beam of a small probe diameter at a higher angle.

The present invention permits manufacturing of a beam tilt lens which is less susceptible to effects of the aberration, has sufficient lens action even for a primary charged particle beam with a large beam tilt angle and large acceleration voltage, and which has action of controlling the primary charged particle beam at an angle for irradiation the primary charged particle beam to the sample, thus making it possible to realize a charged particle beam apparatus which performs tilt observation at a given angle with high resolution. Moreover, as a result of realizing the charged particle beam apparatus which performs inclination observation at a given angle with high resolution, a charged particle beam apparatus capable of three-dimensional, fine defect observation and measured length and shape evaluation can be provided.

Note that the present invention is not limited to the embodiments described above, and includes various modified embodiments. For example, the embodiments described above are provided in detail for easier understanding of the present invention, and is not necessarily limited to the one including all the described configuration. Moreover, it is possible to replace part of the configuration of the given embodiment with the configuration of the other embodiment, and also possible to add the configuration of the given embodiment to the configuration of the other embodiment. Moreover, it is possible to add, delete, and replace the other configuration for part of the configuration of each embodiment.

REFERENCE SINGS LIST

101 Vacuum housing,
102 Electron optical system,
103 Electron optical system controller,
104 Host computer,
105 Operation console,
106 Display means,
110 Primary electron beam (primary charged particle beam),
111 Electron source,
112 Deflector,
113 Beam tilt lens,
114 Sample (wafer),
115 Secondary particle (secondary electron),
116 Booster magnetic path member,
118 Reflection member,
119 Sub-particle (tertiary particle),
122 Central detector,
126 Secondary particle reflection surface,
130 Extraction electrode,
131 Acceleration electrode,
132 Yoke magnetic path member,
133 Solenoid coil,
134 Lens coil,
135 Booster power source,
136 Booster magnetic path member bottom side tip end part,
140 Stage,
141 Stage power source,
142 Lens coil power source,
143 Solenoid coil power source,
144 Solenoid coil power source,
145 Solenoid coil power source,
148 Central intake power source,
210 Solenoid coil,
211 Pole piece,
212 Another solenoid coil,
213 Sample surface,
214 Transverse solenoid coil,
215 Another transverse solenoid coil,
310 Inclined solenoid coil,
312 Another inclined solenoid coil,
410 Arch-type solenoid coil,
411 Another arch-type solenoid coil,
510 Solenoid coil,
710 Primary electron beam (primary charged particle beam),
711 Electron source,
712 Beam tilt lens,
713 Sample,
714 Work distance,
715 Distance from lower end of beam tilt lens to an area immediately above sample,
810 Primary electron beam (primary charged particle beam),
811 Electron source,
812 Condenser lens,
813 Deflector,
814 Beam tilt lens,
815 Sample,
816 Solenoid coil,
820 primary electron beam (primary charged particle beam),
821 Electron source,
822 Condenser lens,
823 Aberration corrector,
824 Beam tilt lens,
825 Sample,
910 Yoke power source,
920 Shield electrode,
930 Control magnetic path member,
931 Control magnetic path power source.

The invention claimed is:

1. A charged particle beam apparatus irradiating a primary charged particle beam to a sample loaded on a stage to detect secondary charged particles generated by the irradiation, the charged particle beam apparatus comprising:

a beam tilt lens having a function of focusing the primary charged particle beam on the sample and tilting the primary charged particle beam onto the sample at a given angle, wherein the beam tilt lens
is a member with a hollow inside provided along a region surrounding the primary charged particle beam,
has a gap for a pole piece at a bottom aperture end on a side opposing the sample, and
further includes: a yoke magnetic path member characterized by having a lens coil therein;
a plurality of solenoid coils arranged in a manner such as to surround the pole piece at the central aperture end of the yoke magnetic path member from outside;

a lens coil power source supplying current to the lens coil to control a focus position of the primary charged particle beam; and a solenoid coil power source supplying current to the solenoid coil to control a tilt angle of the primary charged particle beam, and each solenoid coil has an upper end arranged on a side surface of the yoke magnetic path member and has a lower end arranged between the pole piece tip of the yoke magnetic path member and the sample.

2. The charged particle beam apparatus according to claim 1, wherein the solenoid coil is a solenoid coil having an air core or a core of a non-magnetic material and having a spirally, closely wound insulated conductor.

3. The charged particle beam apparatus according to claim 1, wherein a stage power source maintaining the yoke the beam tilt lens has a booster magnetic path member of a cylindrical or conical shape provided along an inner surface side of the member, wherein a gap of the pole piece in which the magnetic flux excited by the solenoid coil concentrates is formed at a bottom aperture end of the yoke magnetic path member and the booster magnetic path member on the side opposing the sample, wherein the yoke magnetic path member is at a grounding potential, and includes a booster power source supplying a positive potential to the booster magnetic path member, and wherein the plurality of solenoid coils are provided in a manner such as to surround the pole piece of the booster magnetic path member, and each of the solenoid coils has the upper end arranged on an outer side surface of the booster magnetic path member and has the lower end arranged between a tip end of the pole piece of the booster magnetic path member and the sample.

4. The charged particle beam apparatus according to claim 3, wherein the yoke magnetic path member is at a grounding potential, and further includes a stage power source supplying a negative potential to thereby the stage to control landing energy of the primary charged particle beam for the sample at a desired value.

5. The charged particle beam apparatus according to claim 4, wherein the pole piece at the central aperture end is of a conical shape, and the solenoid coil is tilted in a manner such that the lower end of the solenoid coil approaches a central axis on a bottom side of the pole piece to thereby locate the solenoid coil adjacently to the pole piece.

6. The charged particle beam apparatus according to claim 4, wherein the solenoid coil has a spirally, closely wound insulated conductor, and two solenoid coils are provided by bending a core of the solenoid coil for extension, connecting upper ends of the two solenoid coils with a side surface of the pole piece, and projecting the solenoid coils towards the sample side from the lower end of the pole piece.

7. The charged particle beam apparatus according to claim 4, wherein the solenoid coil has an air core or a core of a non-magnetic material, and the air core or the core of the non-magnetic material is arch-shaped.

8. The charged particle beam apparatus according to claim 4, comprising a solenoid coil power source exciting the plurality of solenoid coils, which are arranged in a manner such as to surround the pole piece of the booster magnetic path member, in a manner such as to be proportional to a COS function for each direction with respect to the central axis.

9. The charged particle beam apparatus according to claim 4, wherein the plurality of solenoid coils arranged in a manner such as to surround the pole piece of the booster magnetic path member are coupled together in a manner such as to be divided into a pair of X and Y perpendicular to the central axis while changing a number of turns so that the solenoid coils become proportional to a COS function for each direction of the arrangement.

10. The charged particle beam apparatus according to claim 1, wherein the solenoid coil is cooled to −100 degrees Celsius or below, and is covered with a cylindrical material of a superconductive material or a high-temperature superconductive material.

11. The charged particle beam apparatus according to claim 1, comprising means adapted to adjust peak positions of a transverse magnetic field excited by the solenoid coil and a longitudinal magnetic field excited by the lens coil, wherein tilt coma aberration and tilt chromatic aberration can be suppressed.

12. The charged particle beam apparatus according to claim 1, further comprising:

a condenser lens, and a deflector.

13. The charged particle beam apparatus according to claim 1, further comprising:

a condenser lens, and an aberration corrector.

14. The charged particle beam apparatus according to claim 4, wherein a shield electrode of non-magnetic metal projecting towards a surface of the sample is provided at a tip end part of the pole piece of the booster magnetic path member.

15. The charged particle beam apparatus according to claim 4, wherein a control magnetic path member is provided in a closed space formed by a bottom surface of the yoke magnetic path member and the sample, and the yoke magnetic path member, the control magnetic path member, and the booster magnetic path member are electrically insulated from each other via an insulated material, the yoke magnetic path member is at a grounding potential, and a control magnetic path power source applying a negative potential to the control magnetic path member is provided.

* * * * *